United States Patent
Ching et al.

(10) Patent No.: US 9,773,786 B2
(45) Date of Patent: Sep. 26, 2017

(54) FETS AND METHODS OF FORMING FETS

(71) Applicant: Taiwan Semiconductor Manufacturing Company, Ltd., Hsin-Chu (TW)

(72) Inventors: Kuo-Cheng Ching, Zhubei (TW); Chi-Wen Liu, Hsin-Chu (TW); Chih-Hao Wang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/700,190

(22) Filed: Apr. 30, 2015

(65) Prior Publication Data

US 2016/0322358 A1 Nov. 3, 2016

(51) Int. Cl.
*H01L 27/092* (2006.01)
*H01L 21/8238* (2006.01)
*H01L 29/06* (2006.01)
*H01L 21/02* (2006.01)
*H01L 29/165* (2006.01)

(52) U.S. Cl.
CPC .. *H01L 27/0924* (2013.01); *H01L 21/823821* (2013.01); *H01L 21/823878* (2013.01); *H01L 29/0642* (2013.01); *H01L 21/02236* (2013.01); *H01L 21/02255* (2013.01); *H01L 29/165* (2013.01)

(58) Field of Classification Search
CPC ............. H01L 29/66795; H01L 29/785; H01L 21/823431; H01L 21/823481; H01L 21/76202; H01L 21/76224; H01L 21/823412; H01L 21/823821; H01L 21/845; H01L 27/088; H01L 27/0924; H01L 27/1203; H01L 27/1207
USPC .... 438/283, 197, 440; 257/E21.409, E21.54, 257/E29.001, E29.081, E29.242, E29.255, 257/327, 328, 401, 76, 77
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,171 B1 | 7/2013 | Wu et al. |

(Continued)

FOREIGN PATENT DOCUMENTS

| | | |
|---|---|---|
| KR | 20140138049 A | 12/2014 |
| KR | 20150020984 A | 2/2015 |

*Primary Examiner* — Edward Chin
(74) *Attorney, Agent, or Firm* — Slater Matsil, LLP

(57) ABSTRACT

An embodiment is a method including forming a first fin and a second fin on a substrate, the first fin and the second fin each including a first crystalline semiconductor material on a substrate and a second crystalline semiconductor material above the first crystalline semiconductor material. Converting the first crystalline semiconductor material in the second fin to a dielectric material, wherein after the converting step, at least a portion of the first crystalline semiconductor material in the first fin remains unconverted. Forming gate structures over the first fin and the second fin, and forming source/drain regions on opposing sides of the gate structures.

20 Claims, 39 Drawing Sheets

(56) References Cited

U.S. PATENT DOCUMENTS

| | | | |
|---|---|---|---|
| 8,497,177 B1 | 7/2013 | Chang et al. | |
| 8,609,518 B2 | 12/2013 | Wann et al. | |
| 8,618,556 B2* | 12/2013 | Wu | H01L 21/823821 |
| | | | 257/76 |
| 8,633,516 B1 | 1/2014 | Wu et al. | |
| 8,703,565 B2* | 4/2014 | Chang | H01L 29/66795 |
| | | | 438/283 |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 9,006,786 B2 | 4/2015 | Ching et al. | |
| 9,209,202 B2* | 12/2015 | Ponoth | H01L 21/76224 |
| 2009/0278196 A1* | 11/2009 | Chang | H01L 21/823412 |
| | | | 257/328 |
| 2010/0163971 A1* | 7/2010 | Hung | H01L 29/66795 |
| | | | 257/327 |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2014/0302645 A1 | 10/2014 | Rodder et al. | |
| 2015/0021691 A1 | 1/2015 | Akarvardar et al. | |
| 2015/0028426 A1* | 1/2015 | Ching | H01L 29/785 |
| | | | 257/401 |

\* cited by examiner

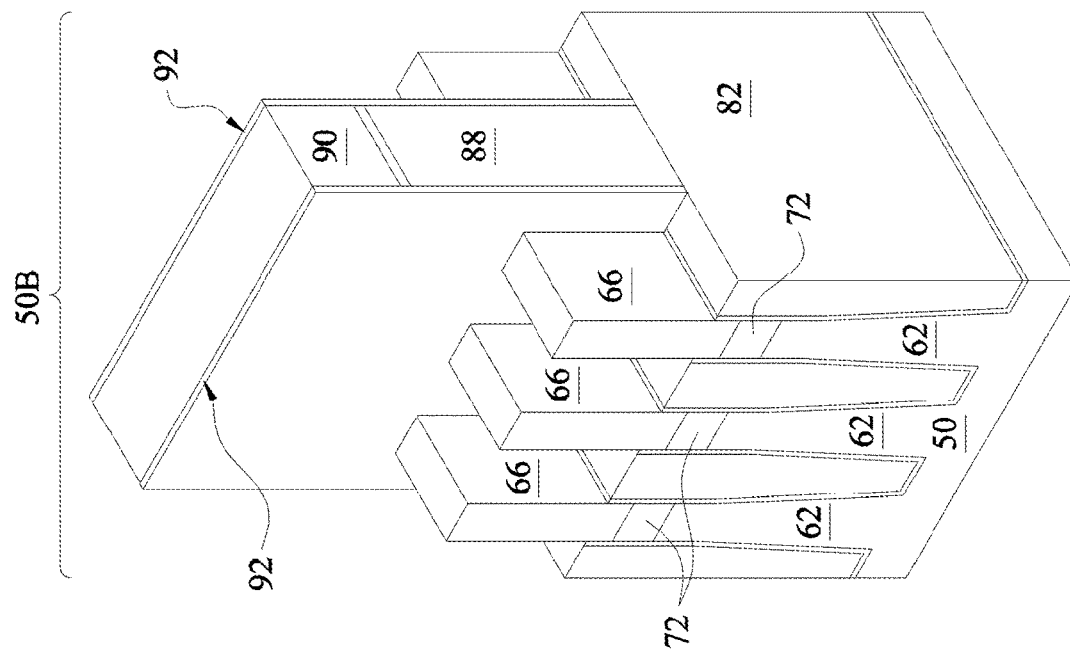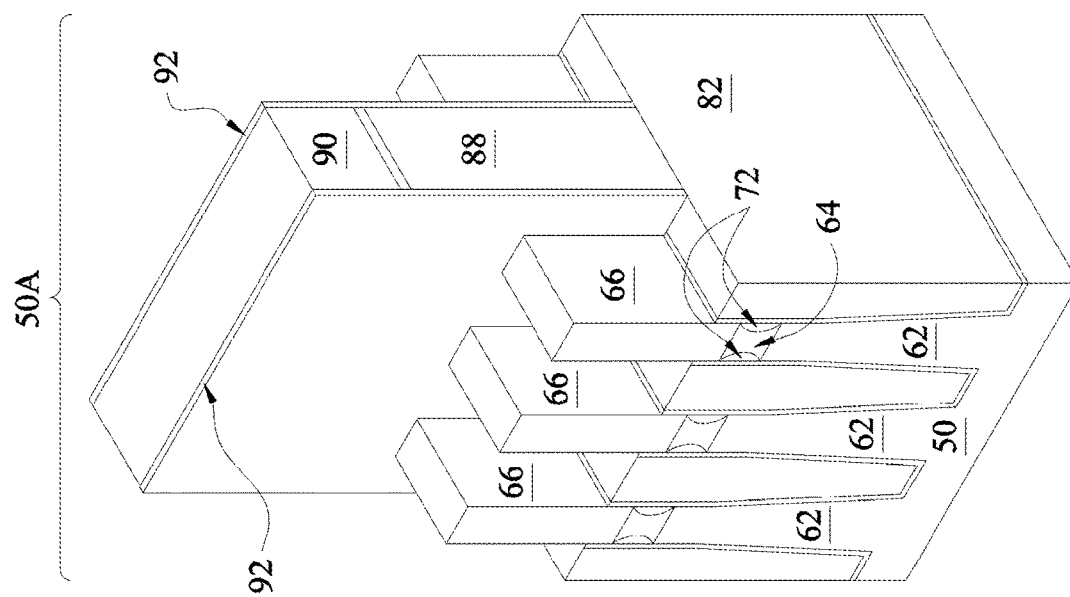
Figure 12A

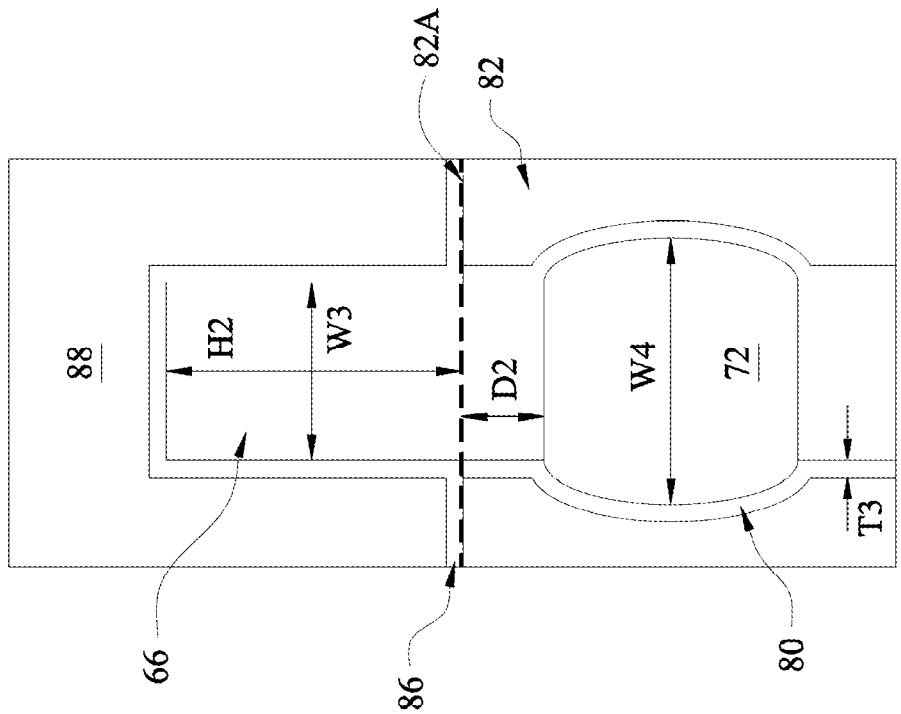
Figure 13B2
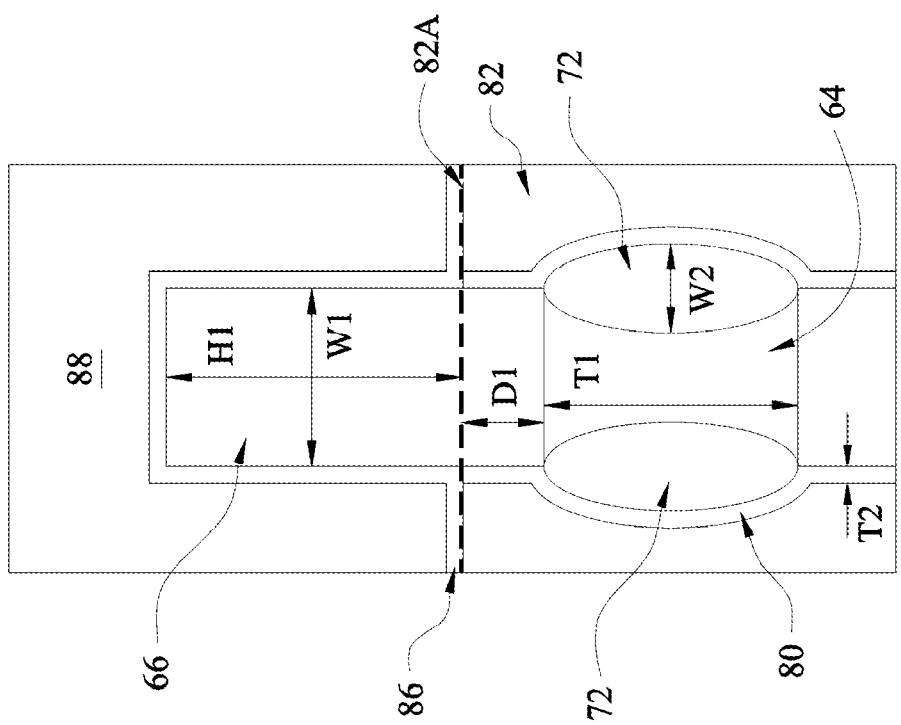
Figure 13B1

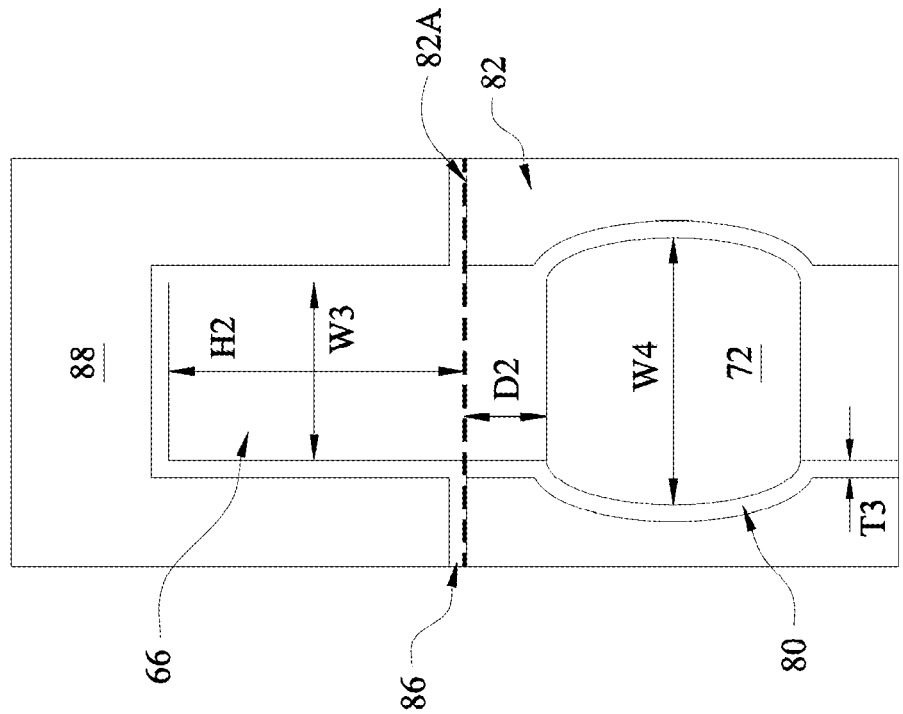
Figure 16B2
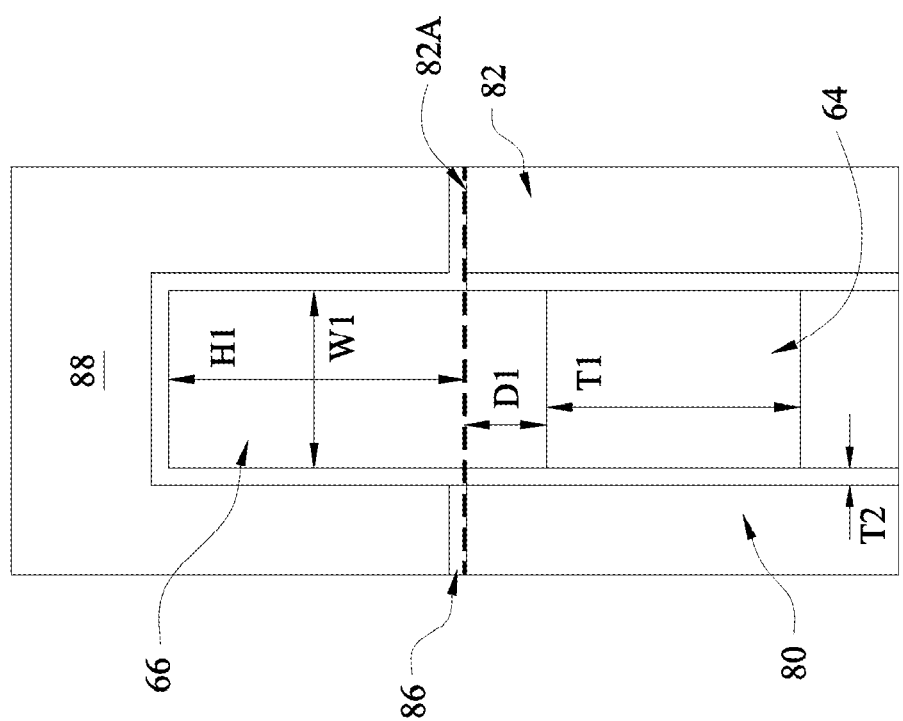
Figure 16B1

FETS AND METHODS OF FORMING FETS

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides.

However, there are challenges to implementation of such features and processes in semiconductor fabrication. For example, poor isolation between adjacent fins causes high leakage current of the FinFET, thereby degrading the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A-4B, 5A-5B, 6A-6B, 7A-B, 8A-8B, 9A-9B, 10A-10B, 11A-11B, 12A-B, and 14A-14C are cross-sectional views of intermediate stages in the manufacturing of FinFETs in accordance with some embodiments.

FIGS. 13B1-13B2 are detailed cross-sectional views of aspects of structures in accordance with some embodiments.

FIGS. 16B1-16B2 are detailed cross-sectional views of aspects of structures in accordance with some embodiments.

DETAILED DESCRIPTION

Figure 1:
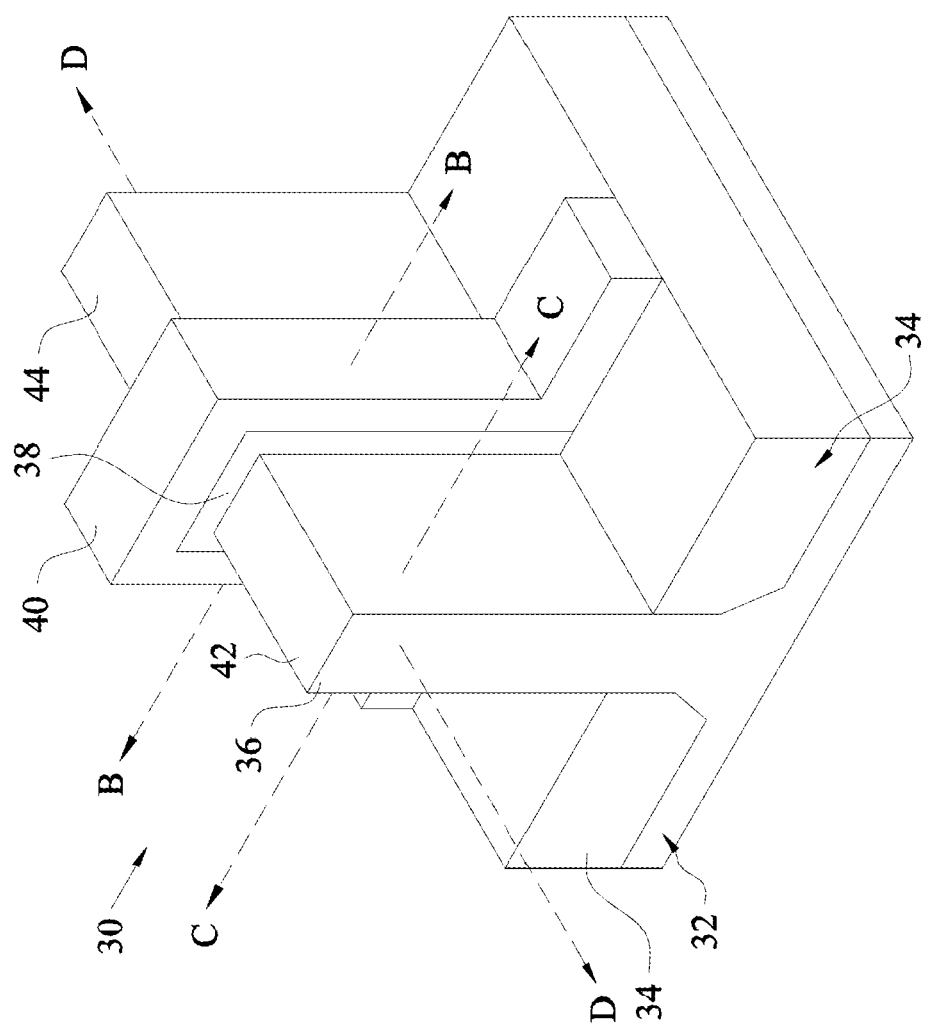
FIG. 1 is an example of a Fin Field-Effect Transistor (FinFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last process. In other embodiments, a gate-first process may be used. Also, some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a simple and cost-effective process flow to achieve an undoped channel in a FinFET for device enhancement. In addition, this simple and cost-effective process flow may achieve a channel on insulator scheme (sometimes referred to as a channel on oxide). In particular, embodiments such as those disclosed below include different amounts of oxidation of a semiconductor layer for different regions of the device to achieve performance improvements and enhancements. For example, in a first region containing n-type devices, such as NMOS transistors, an epitaxial semiconductor layer (e.g. SiGe layer) is partially oxidized or not oxidized at all to achieve tensile strain enhancement in the first region, while in a second region containing p-type devices, such as PMOS transistors, an epitaxial semiconductor layer (e.g. SiGe layer) is fully oxidized to avoid the tensile strain penalty in the second region. In addition, in other regions of the device, such as contact pickup areas and/or passive device areas, an epitaxial semiconductor layer (e.g. SiGe layer) can be partially oxidized or not oxidized to enhance the performance of these regions as well. Further, with the disclosed process, epitaxial portions of the fins are epitaxially grown as blanket layers which have fewer defects and are generally a higher quality semiconductor structure than structures epitaxially grown in trenches/recesses.

FIG. 1 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section B-B is across a channel, gate dielectric 38, and gate electrode 40 of the finFET 30. Cross-section C-C is parallel to cross-section A-A and is across a source/drain region 42. Cross-section D-D is perpendicular to cross-section A-A and is along a longitudinal axis of the fin 36 and in a direction of, for example, a current flow between the source/drain regions 42 and 44. Subsequent figures refer to these reference cross-sections for clarity.

Figure 14A:
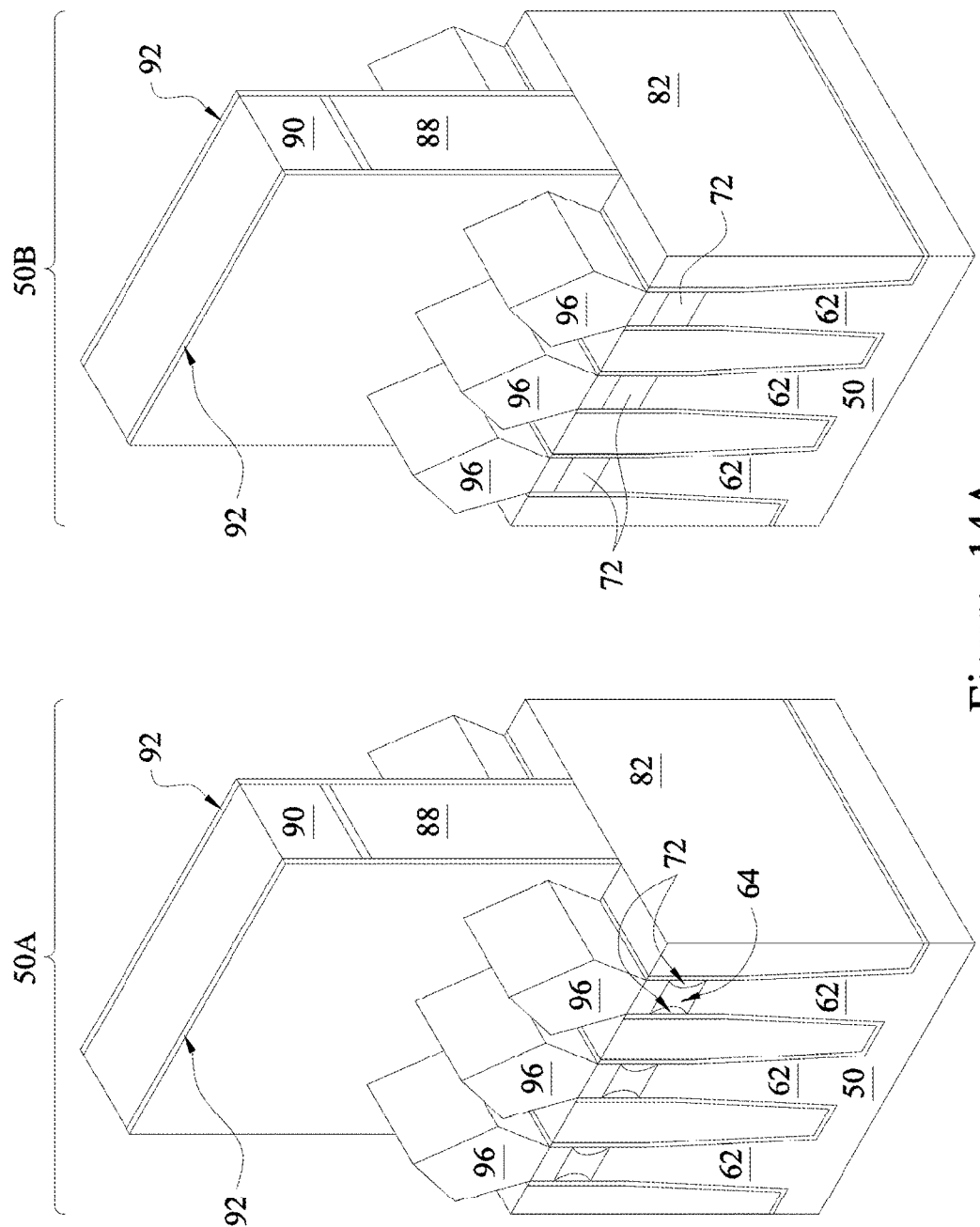
Figure 14B:
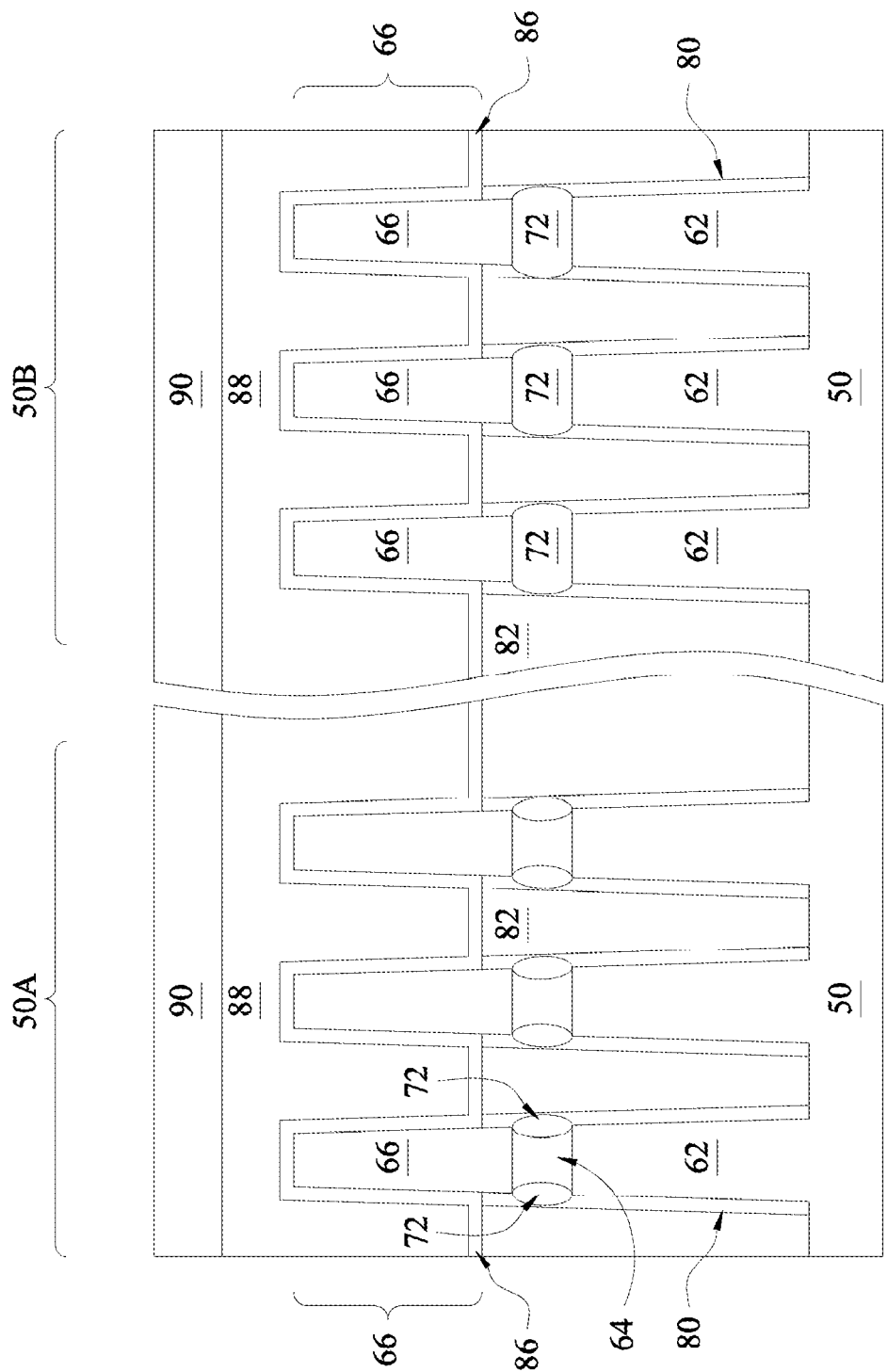
Figure 14C:
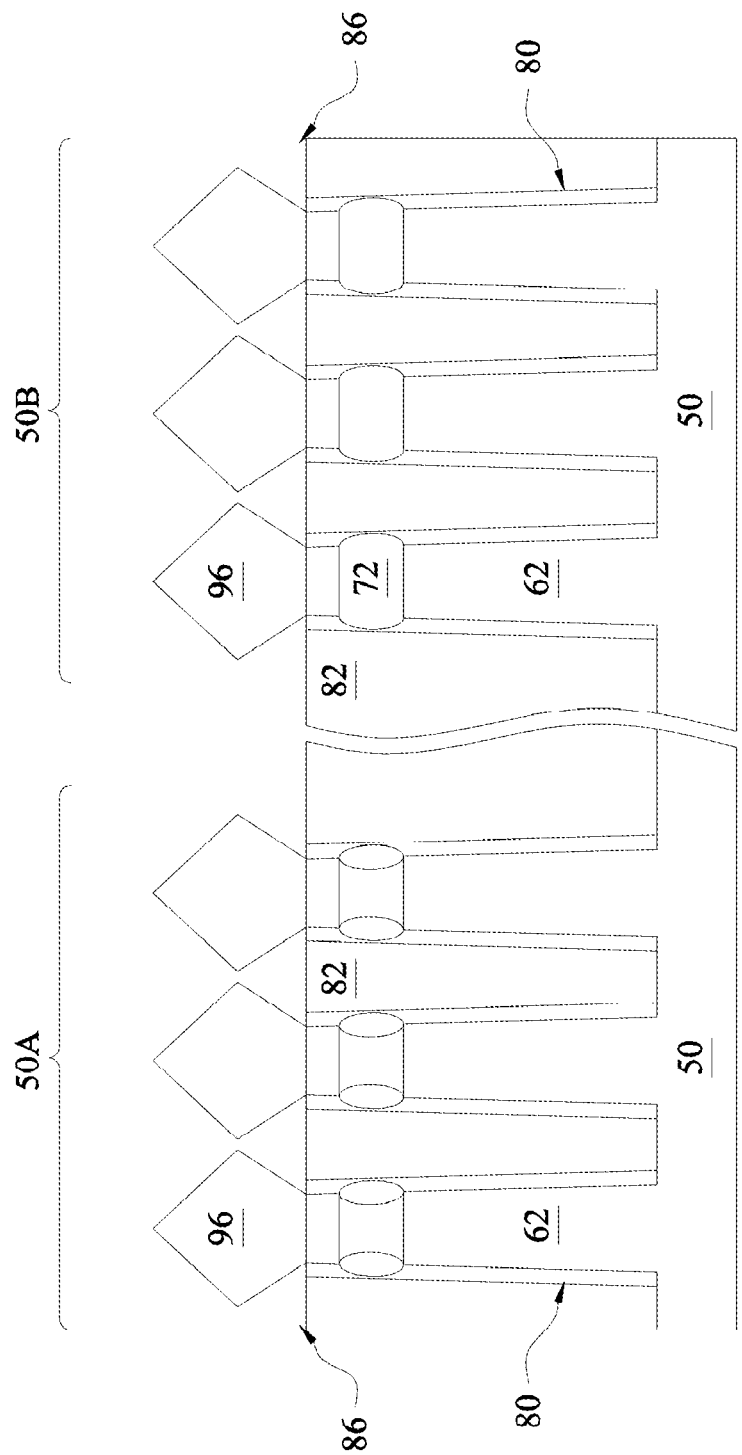
Figure 15:
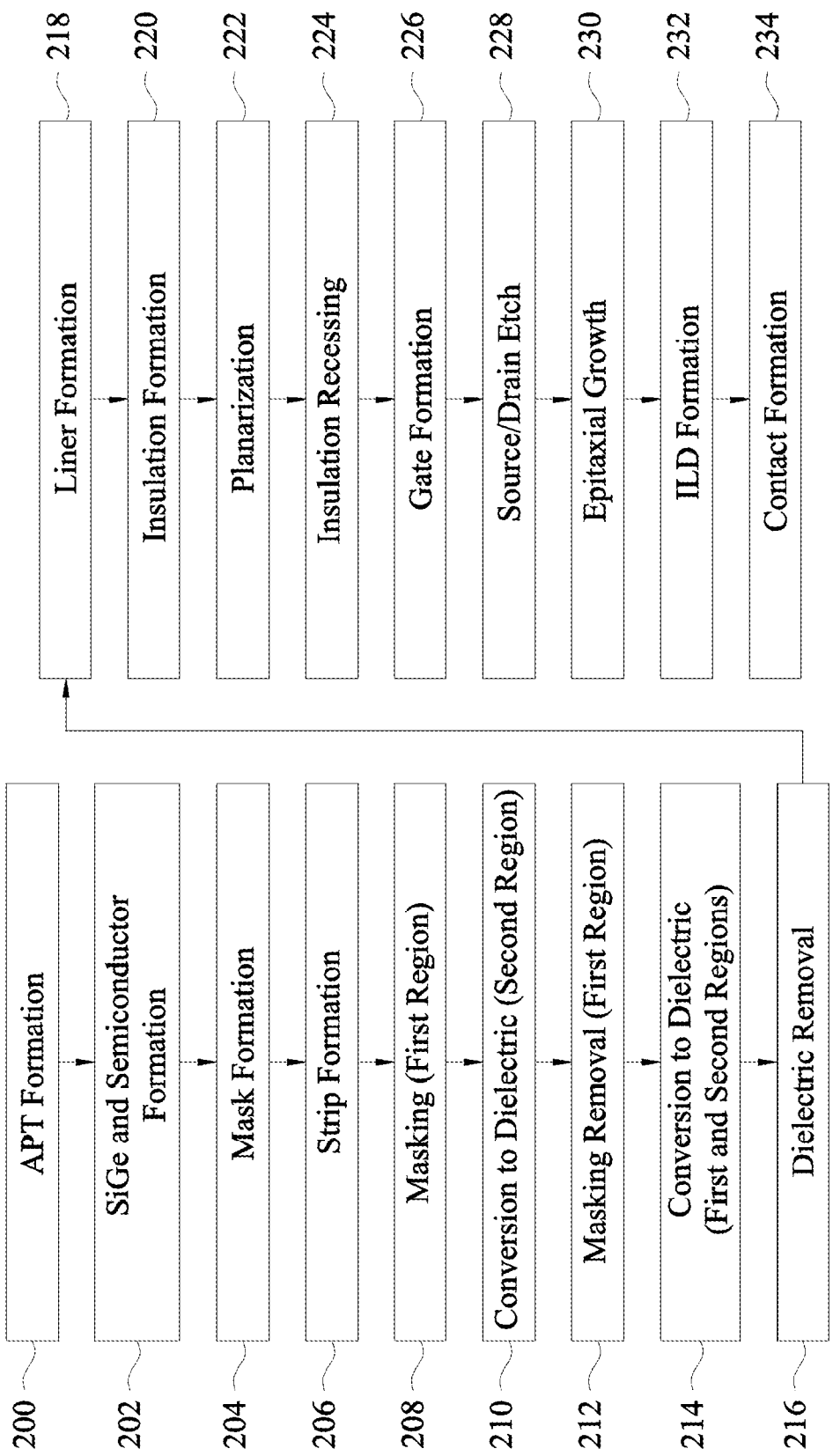
FIG. 15 is a process flow of a process in accordance with some embodiments.

FIGS. 2 through 14C are cross-sectional views of intermediate stages in the manufacturing of FinFETs in accordance with an exemplary embodiment, and FIG. 15 is a process flow of the process shown in FIGS. 2 through 14C. FIGS. 2 through 14C illustrate a FinFET similar to FinFET 30 in FIG. 1, except for multiple FinFETs. In FIGS. 4A through 14C, figures ending with an "A" designation are three-dimensional views; figures ending with a "B" designation illustrate cross-section B-B; and figures ending with a "C" designation illustrate cross-section C-C.

Figure 2:
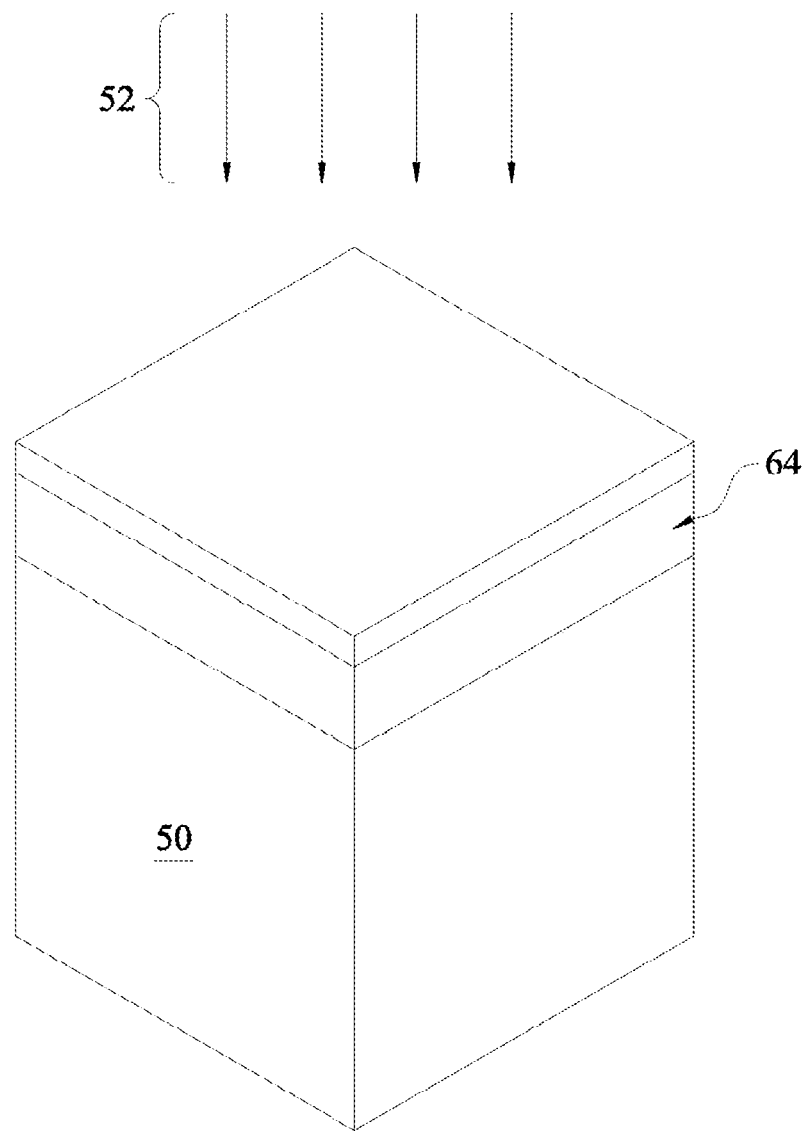

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

FIG. 2 illustrates the formation of an anti-punch through (APT) region (not shown) in the substrate 50 (step 200). In some embodiments, the APT region is formed with an implantation step 52 performed on a top portion of the substrate 50. The conductivity type of the dopants implanted in the APT is the same as that of the well region (not shown) of the substrate 50. The APT region extends under the subsequently formed source/drain regions 96 (FIGS. 14A and 14C), and is used to reduce the leakage from source/drain regions 96 to substrate 50. The doping concentration in APT region may be in the range between about $1E18/cm^3$ and about $1E19/cm^3$.

FIG. 2 further illustrates the formation of a silicon germanium (SiGe) layer 64 (e.g. a blanket layer) on the substrate 50 (step 202). In some embodiments, the SiGe layer 64 is formed before the APT formation step, and in other embodiments, the SiGe layer 64 is formed after the APT formation step. In some embodiments, the SiGe layer 64 and the semiconductor layer 66 are formed by epitaxial processes and are crystalline layers. In some embodiments, the SiGe layer 64 is formed to have a thickness in a range from about 20 nm to about 90 nm. The germanium percentage (atomic percentage) of SiGe layer 64 after formation is in the range from about 30 percent to about 80 percent, while higher or lower germanium percentages may be used. It is appreciated, however, that the values recited throughout the description are examples, and may be changed to different values.

Figure 3:
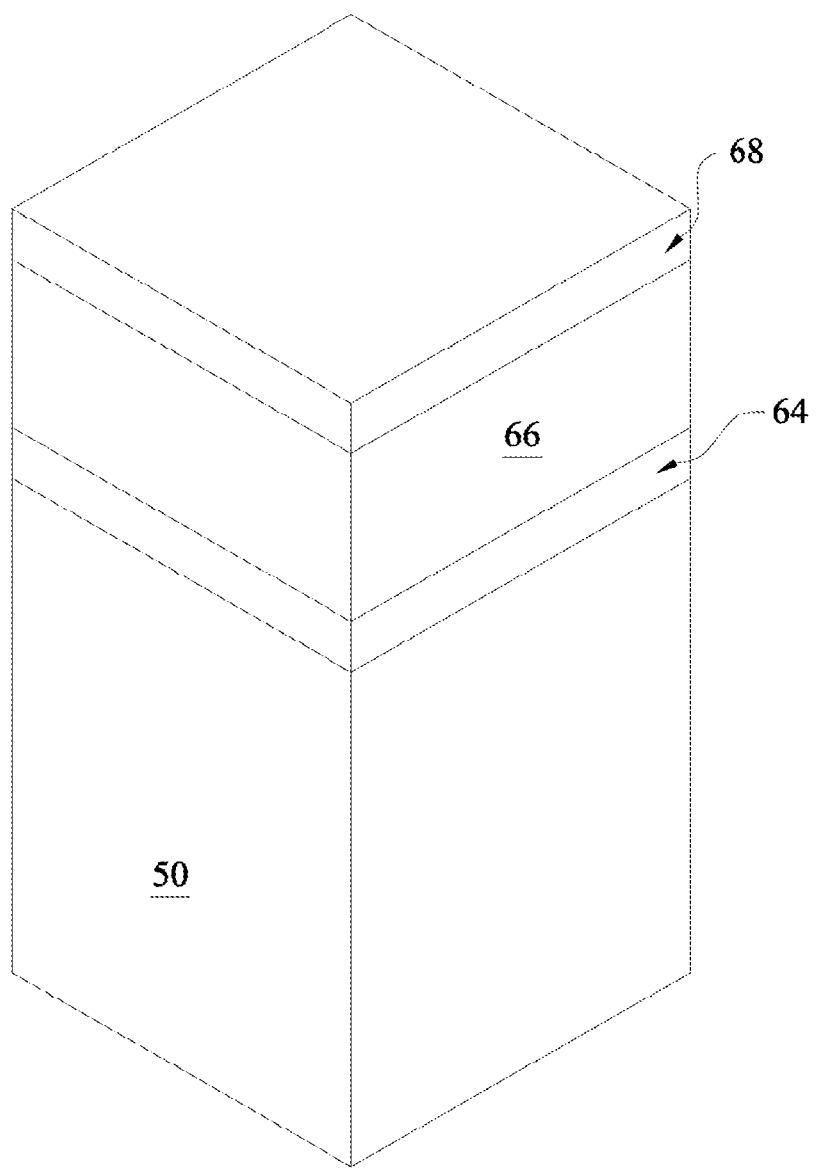

FIG. 3 illustrates forming a semiconductor layer 66 (e.g. a blanket layer) on the SiGe layer 64 (step 202). The semiconductor layer 66 formed over the SiGe layer 64 may include one or more semiconductor layers. In some embodiments, the semiconductor layer 66 is a pure silicon layer that contains no germanium. In some embodiments, the semiconductor layer 66 may be a substantially pure silicon layer that, for example, contains less than about 1 percent of germanium. The semiconductor layer 66 may be an intrinsic layer and may not be doped with p-type and n-type dopants.

FIG. 3 further illustrates the formation of a mask layer 68 over the semiconductor layer 66 (step 204). In some embodiments, the mask layer 68 is a hard mask and may be referred to as hard mask 68 hereinafter. The hard mask 68 may be formed of silicon nitride, silicon oxynitride, silicon carbide, silicon carbonitride, the like, or a combination thereof and may be formed by any suitable methods known in the art such as chemical vapor deposition (CVD), plasma-enhanced CVD (PECVD), the like, or a combination thereof. In some embodiments, the hard mask 68 is a conformal layer.

Figure 4A:
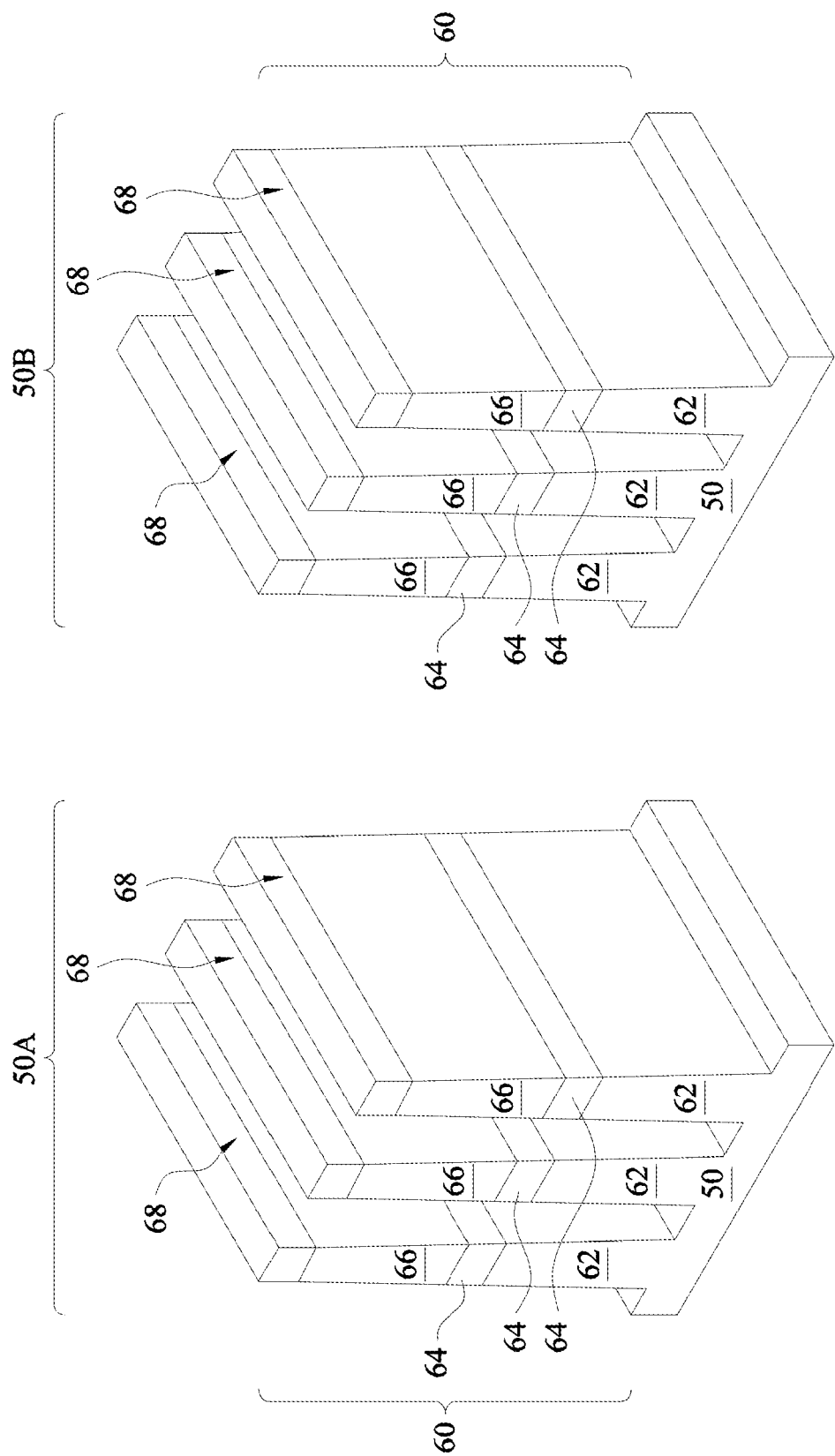
Figure 4B:
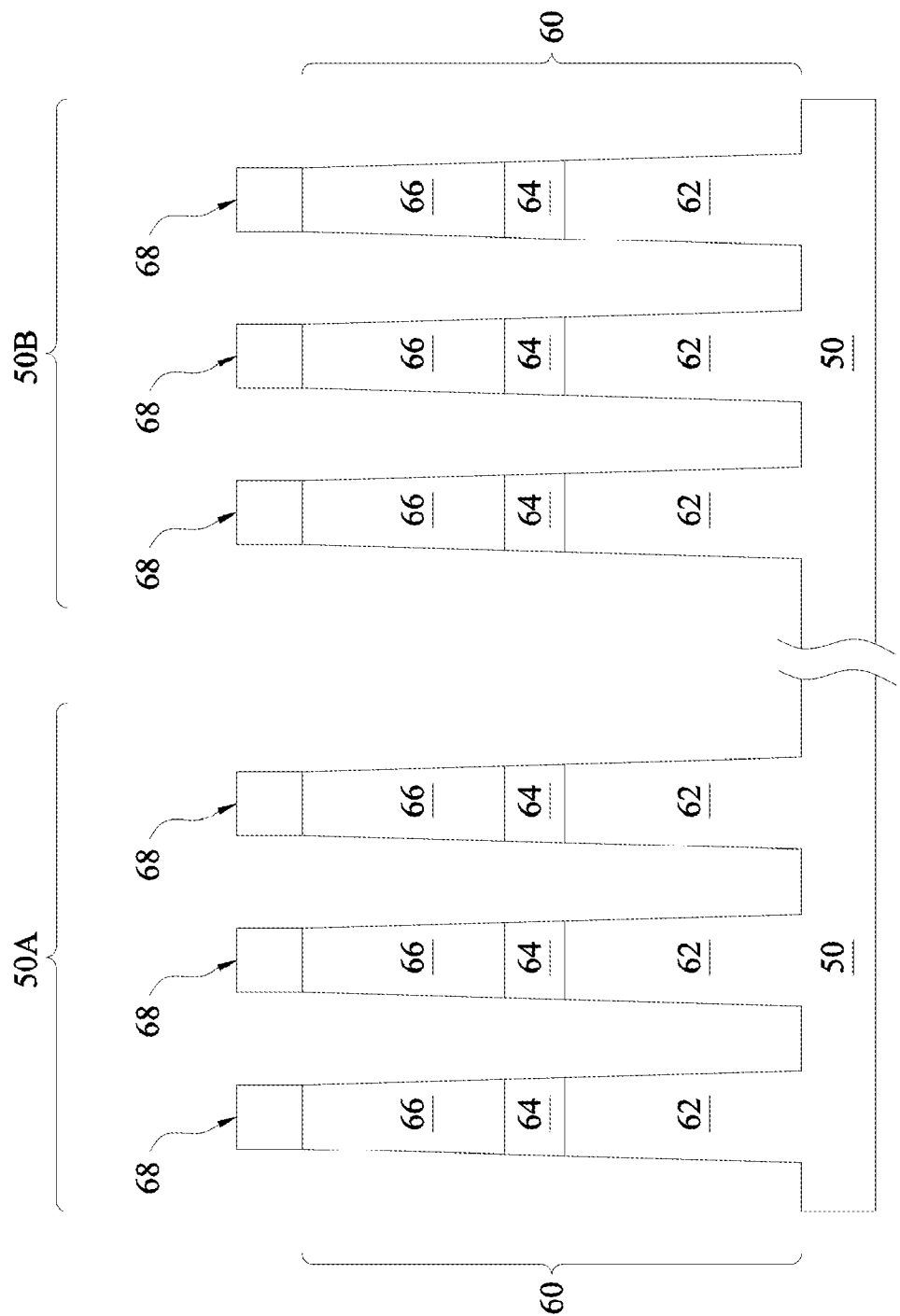

FIGS. 4A and 4B illustrate the formation of semiconductor strips 60 (step 206) on the substrate 50. As illustrated in FIGS. 4A and 4B and subsequent figures, the substrate 50 has a first region 50A and a second region 50B. The first region 50A can be for forming n-type devices, such as NMOS transistors, such as n-type FinFETs. The second region 50B can be for forming p-type devices, such as PMOS transistors, such as p-type FinFETs.

In some embodiments, the semiconductor strips 60 may be formed by etching trenches in the hard mask 68, the semiconductor layer 66, the SiGe layer 64, and the substrate 50. The patterned portions of the substrate 50 are referred to as patterned substrate 62 as illustrated in FIGS. 4A and 4B. The patterned portions of the semiconductor layer 66, the SiGe layer 64, and the patterned substrate 62 collectively make up the semiconductor strips 60. The semiconductor strips 60 may also be referred to as semiconductor fins 60. The etching may be any acceptable etch process, such as a reactive ion etch (RIE), neutral beam etch (NBE), the like, or a combination thereof. The etch may be anisotropic.

Figure 5A:
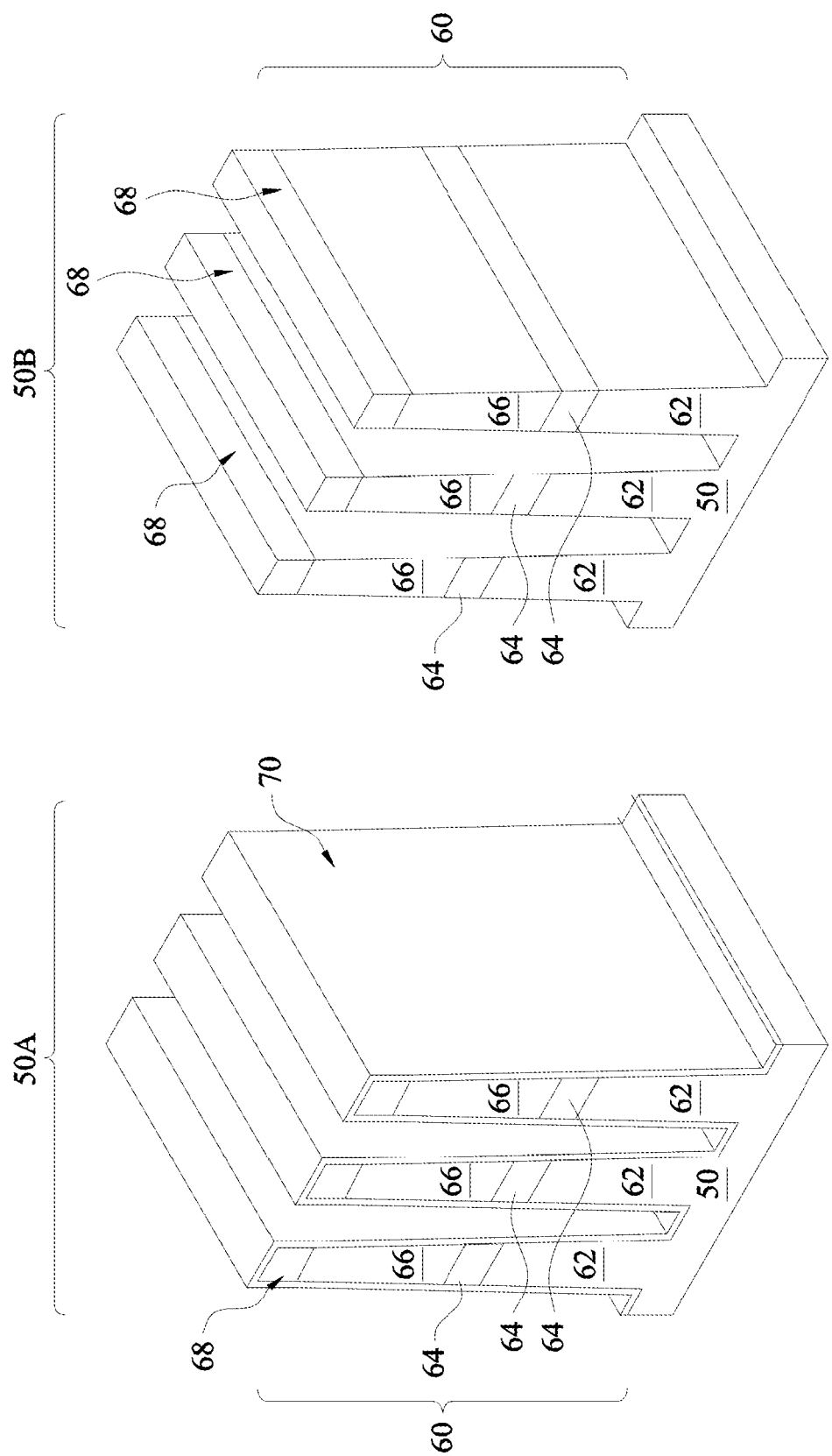
Figure 5B:
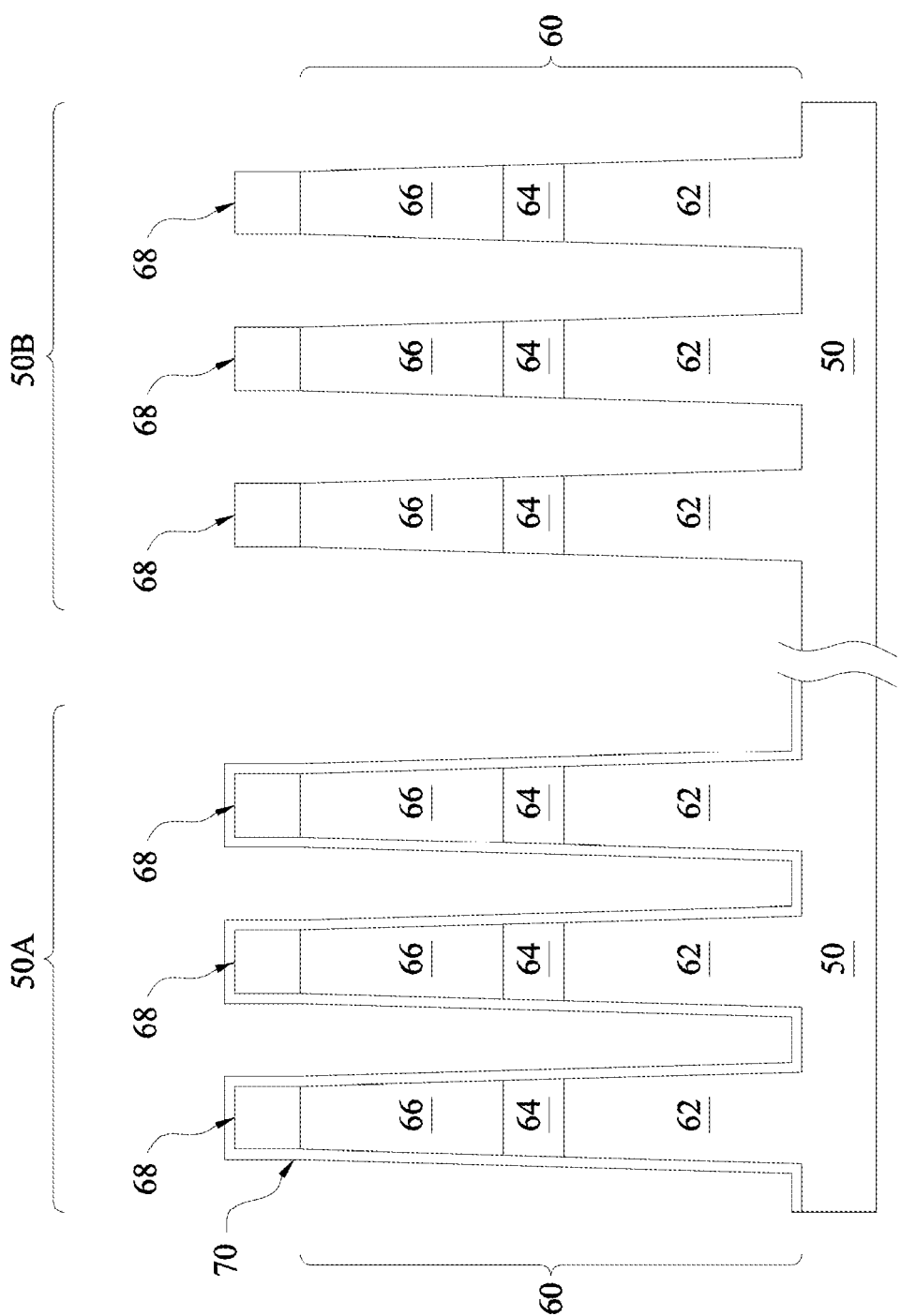

In FIGS. 5A and 5B, a mask layer 70 is formed over the first region 50A of the substrate 50 while the second region 50B is exposed (step 208). In some embodiments, the mask layer 70 is a hard mask and may be referred to as hard mask 70 hereinafter. The hard mask 70 may be formed of silicon nitride, silicon oxynitride, silicon carbide, silicon carbonitride, the like, or a combination thereof and may be formed by any suitable methods known in the art such as CVD, PECVD, the like, or a combination thereof. In some embodiments, the hard mask 70 is a conformal layer. In some embodiments, the mask layer 70 may be a photoresist patterned by an acceptable photolithography process or the like.

Figure 6A:
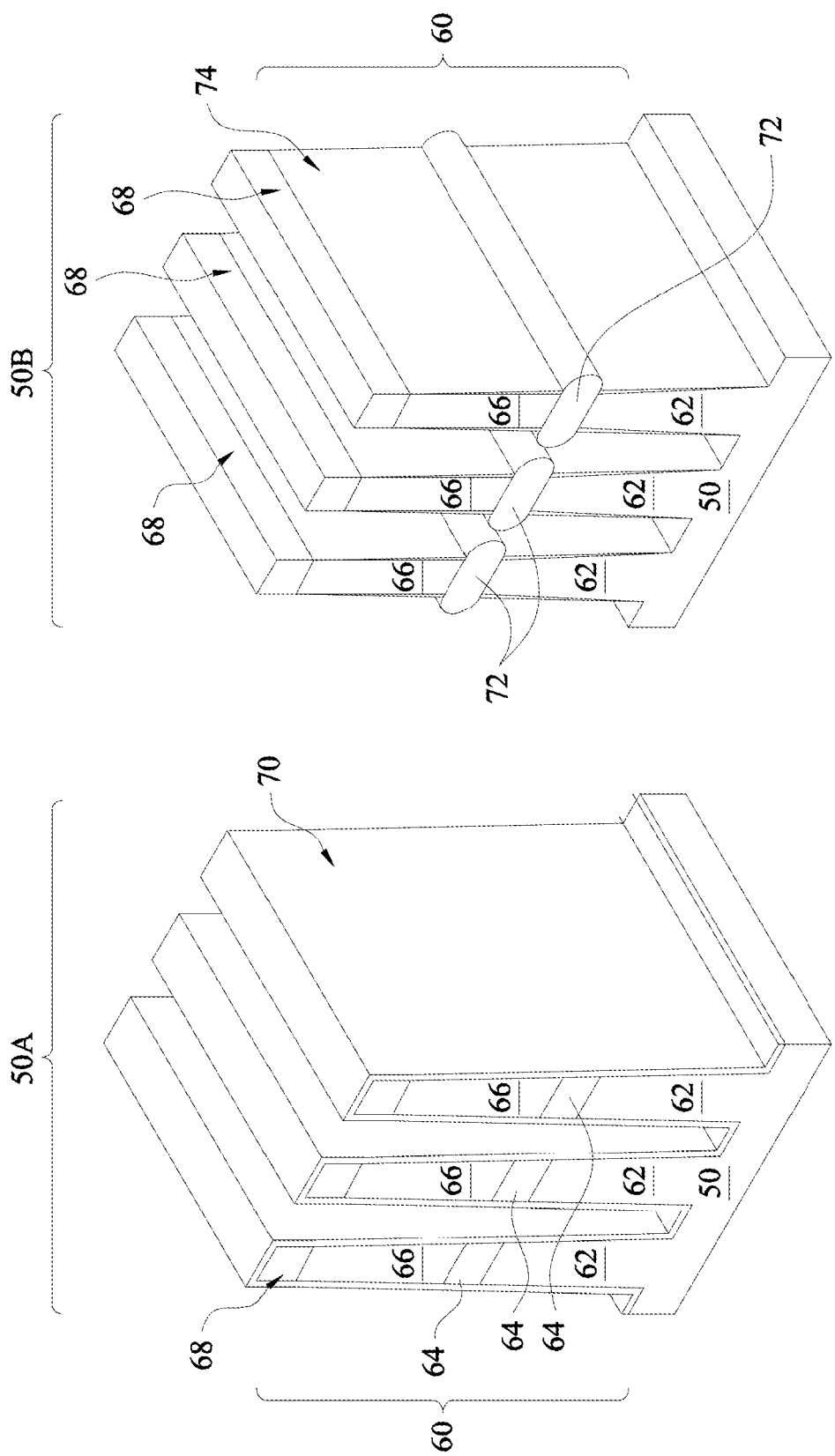
Figure 6B:
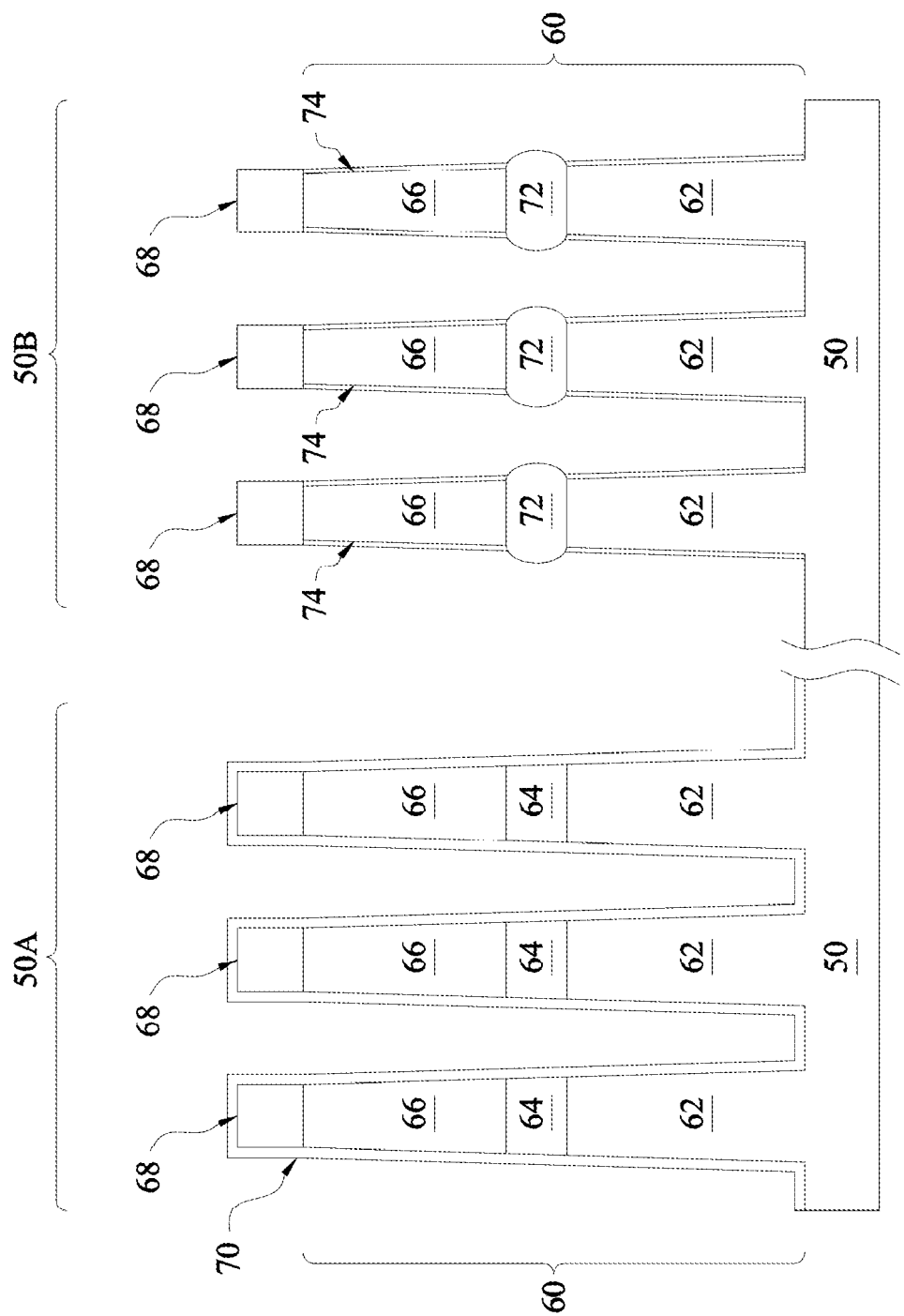

In FIGS. 6A and 6B, portions of the semiconductor strips 60 in the second region 50B of the substrate 50 are converted to a dielectric material (step 210). In some embodiments, the conversion process is an oxidation process. The oxidation process may use a steam furnace. For example, the substrate 50 including the semiconductor strips 60 may be placed in a furnace such that the second region 50B of the substrate 50 is exposed to a steam environment while the first region 50A of the substrate 50 is protected by the mask layer 70. The steam environment may be generated at a temperature between about 400° C. and about 600° C., such as about 500° C. Water ($H_2O$) steam may be provided flowing at a flow rate of between about 100 sccm and about 1000 sccm. The second region 50B of the substrate 50 may be exposed to the steam environment in the furnace for a duration in a range from about 0.5 hour to about 3 hour, such as about 1 hour. As illustrated in FIGS. 6A and 6B, outer portions of the semiconductor layer 66 and the patterned substrate 62 in the second region 50B may be converted into dielectric material regions 74. In addition, the SiGe layer 64 may be fully converted into SiGe dielectric regions 72. In some embodiments, the SiGe dielectric regions 72 may be formed of SiGeO. Other conversion processes may be used.

In some embodiments, the conversion process may be a directional conversion process such as a directional oxidation process using the hard mask 70 as an oxidation mask. An example of a directional oxidation process is gas cluster ion beam oxidation.

Figure 7A:
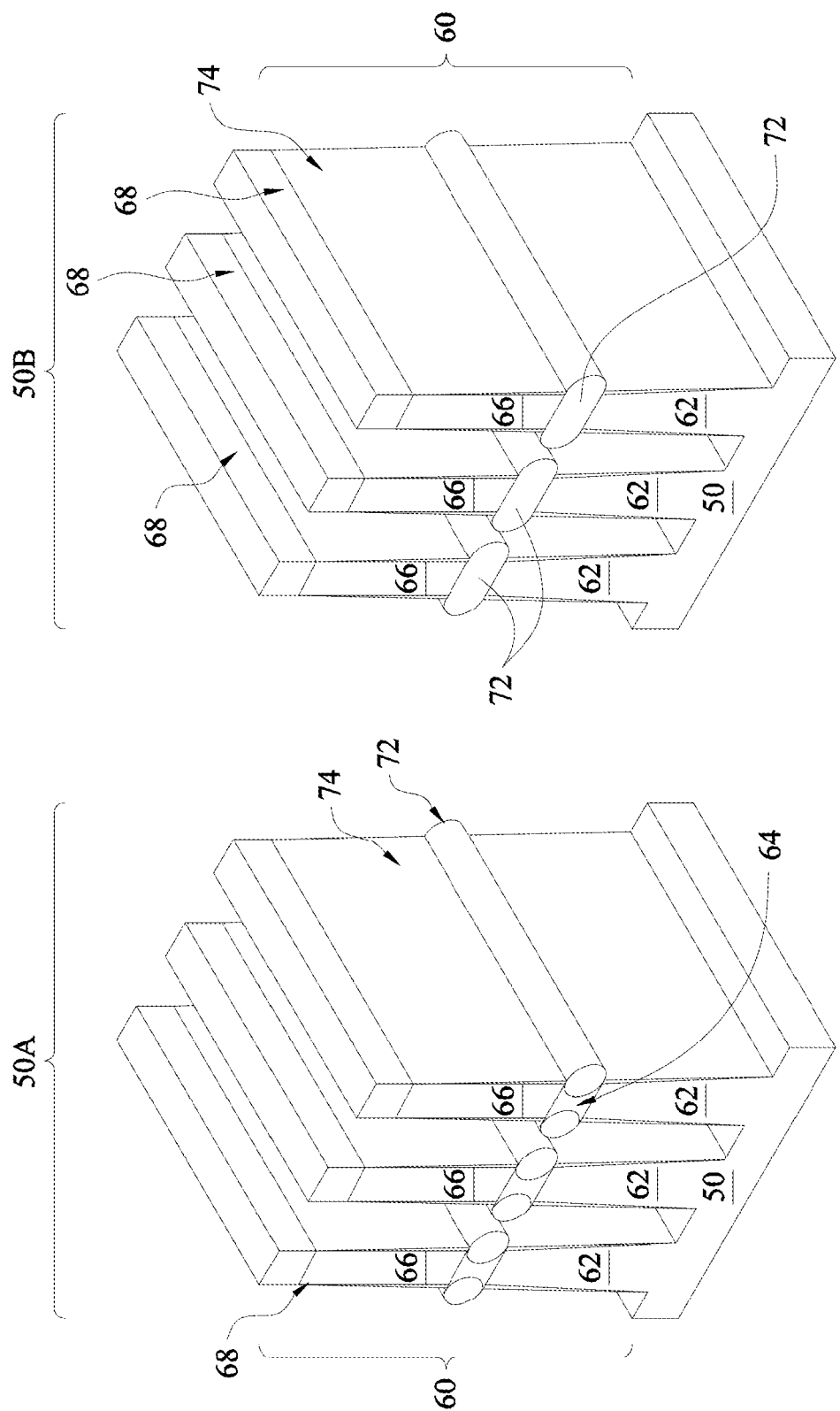
Figure 7B:
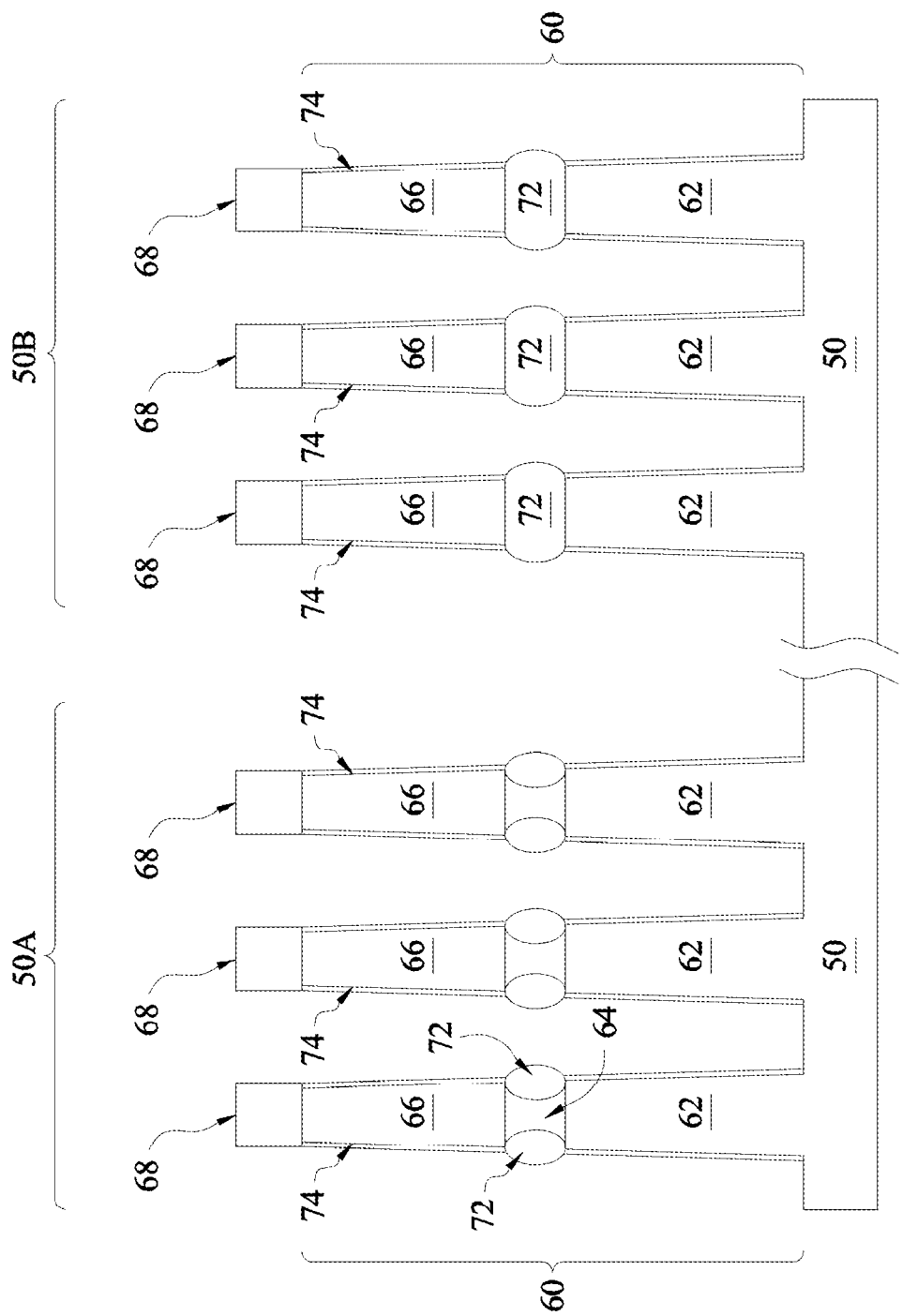

In FIGS. 7A and 7B, the mask layer 70 is removed from the first region 50A of the substrate 50 (step 212) such that the first region 50A and the second region 50B are exposed. The mask layer 70 may be removed using an etch, a chemical mechanical polish (CMP) process, or the like. In other embodiments, if the mask layer 70 is a photoresist, the mask layer 70 may be removed by an appropriate ashing process, such as using an oxygen plasma.

After the mask layer 70 is removed from the first region 50A of the substrate 50, portions of the semiconductor strips 60 in the first region 50A of the substrate 50 are converted into a dielectric material and portions of the semiconductor strips 60 in the second region 50B of the substrate 50 are further converted to a dielectric material (step 214). This conversion process may be similar to the conversion process previously described in FIGS. 6A-B and the description is not repeated herein. As illustrated in FIGS. 7A and 7B, in the first region 50A of the substrate 50, outer portions of the semiconductor layer 66 and the patterned substrate 62 may be converted into dielectric material regions 74. In addition, in the first region 50A of the substrate 50, the SiGe layer 64 may be partially converted into SiGe dielectric regions 72 while some of the SiGe layer 64 remains unconverted. In the illustrated embodiment in FIGS. 7A and 7B, the SiGe layer 64 in the first region 50A of the substrate 50 are converted to a dielectric material 72 to an extent such that a continuous region of the SiGe layer 64 remains between the patterned substrate 62 and the patterned semiconductor layer 66.

Figure 8A:
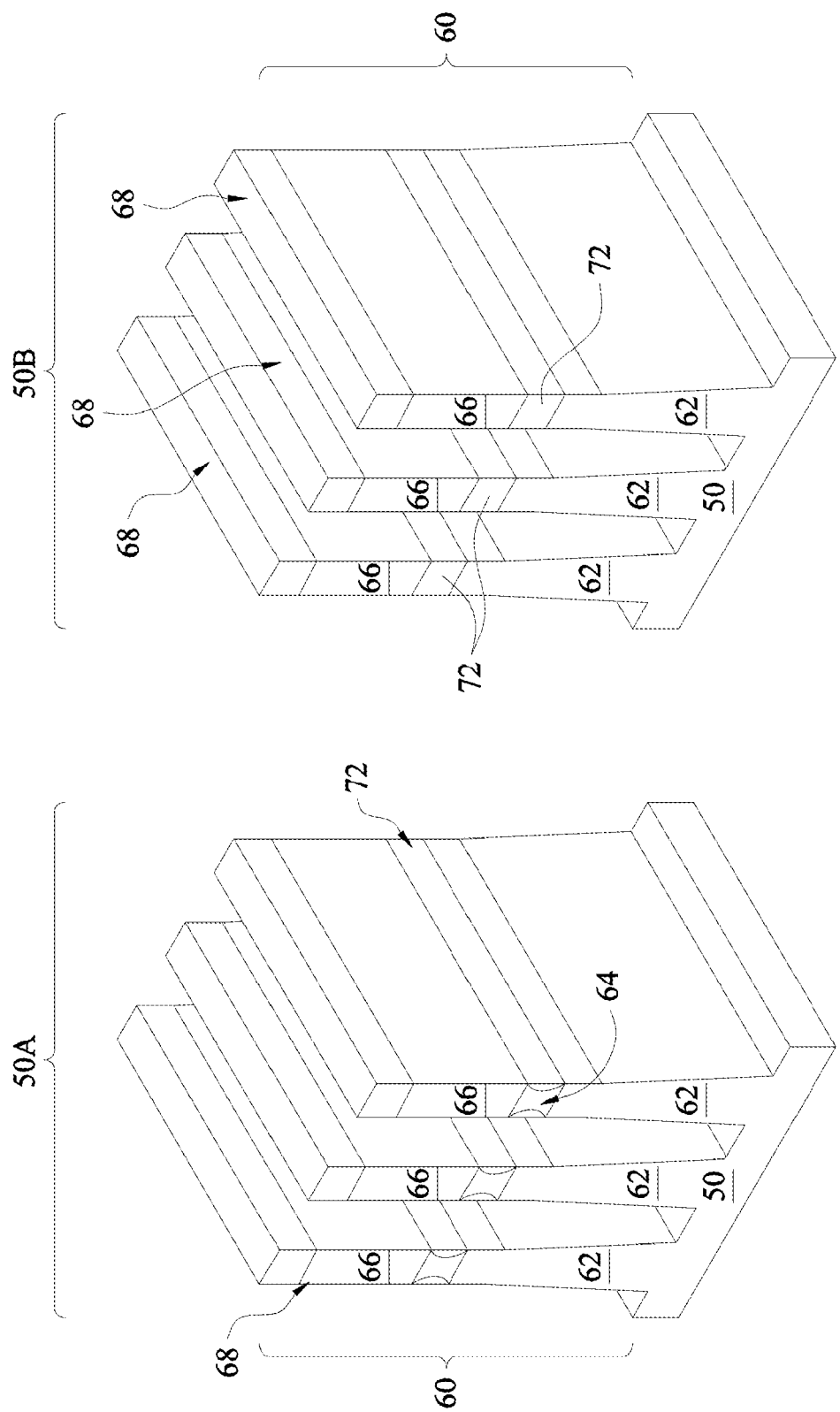
Figure 8B:
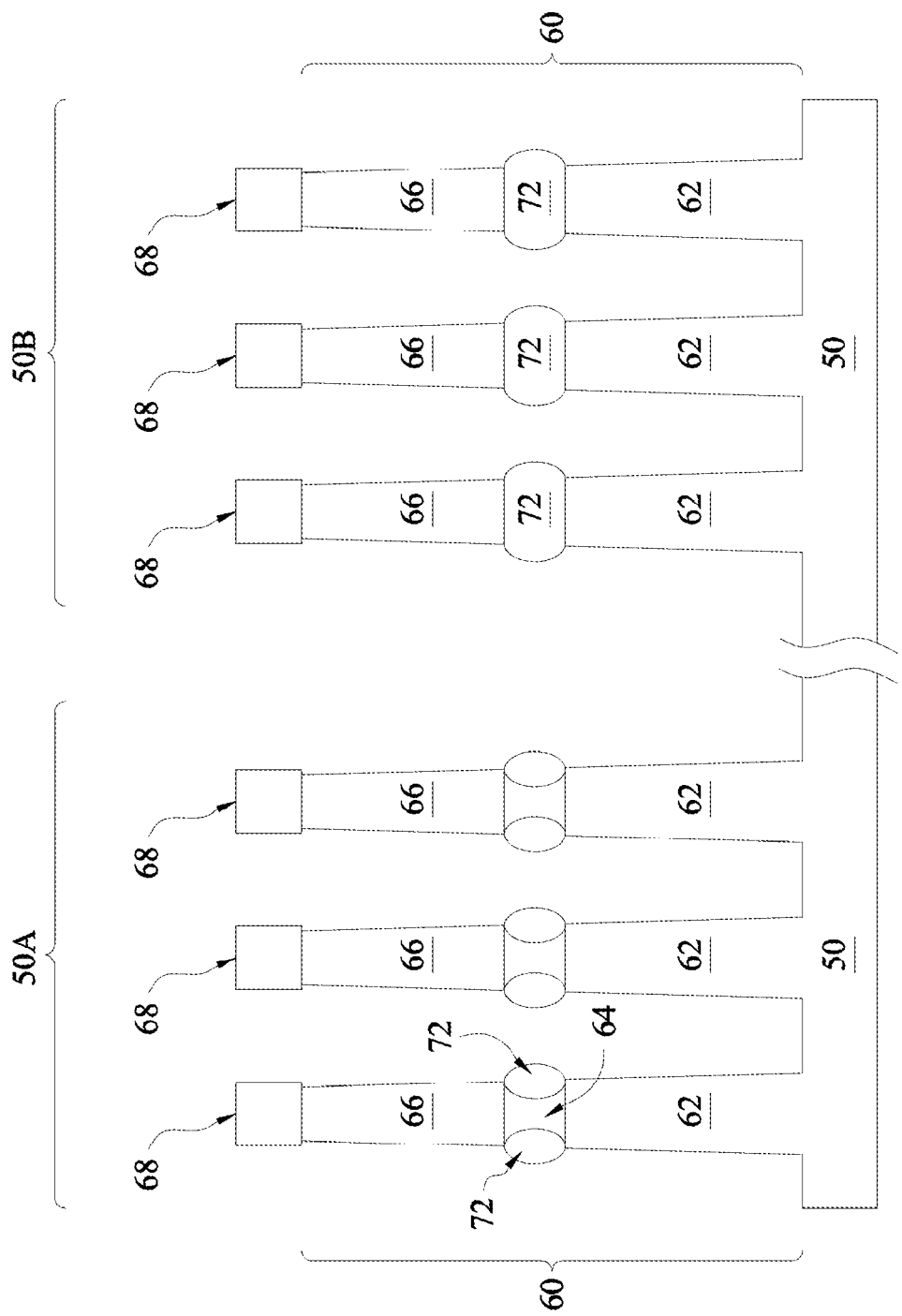

In FIGS. 8A and 8B, the dielectric material regions 74 and optionally portions of the SiGe dielectric regions 72 are removed (step 216). The removal of the dielectric material regions 74 reduces the width of the semiconductor strips 60 as the portions of the semiconductor strips 60 that were previously converted into dielectric material are removed. Because the second region 50B had two conversion processes performed on it while the first region 50A had only one conversion process performed on it, more of the semiconductor strips 60 in the second region 50B are converted into the dielectric material regions 74 such that the widths of the remaining semiconductor layer 66 and patterned substrate 62 of the semiconductor strips 60 in the second region 50B are less than the widths of the remaining semiconductor layer 66 and patterned substrate 62 of the semiconductor strips 60 in the first region 50A.

The dielectric material regions 74 may be removed by an etch process. The etching may be any acceptable etch process, such as a wet etch process, a dry etch process, the like, or a combination thereof. The etch may be isotropic or anisotropic. In the embodiment illustrated in FIGS. 8A and 8B, the etch process is selective to the SiGe dielectric regions 72, the semiconductor layer 66, and the patterned substrate 62 such that the SiGe dielectric regions 72 are not substantially etched. In another embodiment (not shown), the SiGe dielectric regions 72 are also etched to have sidewalls that are coterminous with the sidewalls of the semiconductor layers 66 and patterned substrate 62.

After the dielectric material regions 74 are removed, a cleaning process may be performed to remove any native oxide, migrated germanium, or the like from the surface of the semiconductor strips 60. The cleaning may be performed using diluted hydrofluoric (dHF) acid.

By partially converting (e.g. oxidizing) the SiGe layer 64 in the first region 50A (e.g. n-type region) and fully converting (e.g. oxidizing) the SiGe layer 64 in the second region 50B (e.g. p-type region), the performance of the two device types can be optimized in, for example, a complementary metal-oxide-semiconductor (CMOS) device. The n-type device achieves the performance enhancements afforded by the tensile strain gain due to the remaining SiGe layer 64 while the p-type device avoids the performance penalty of tensile strain.

Figure 9A:
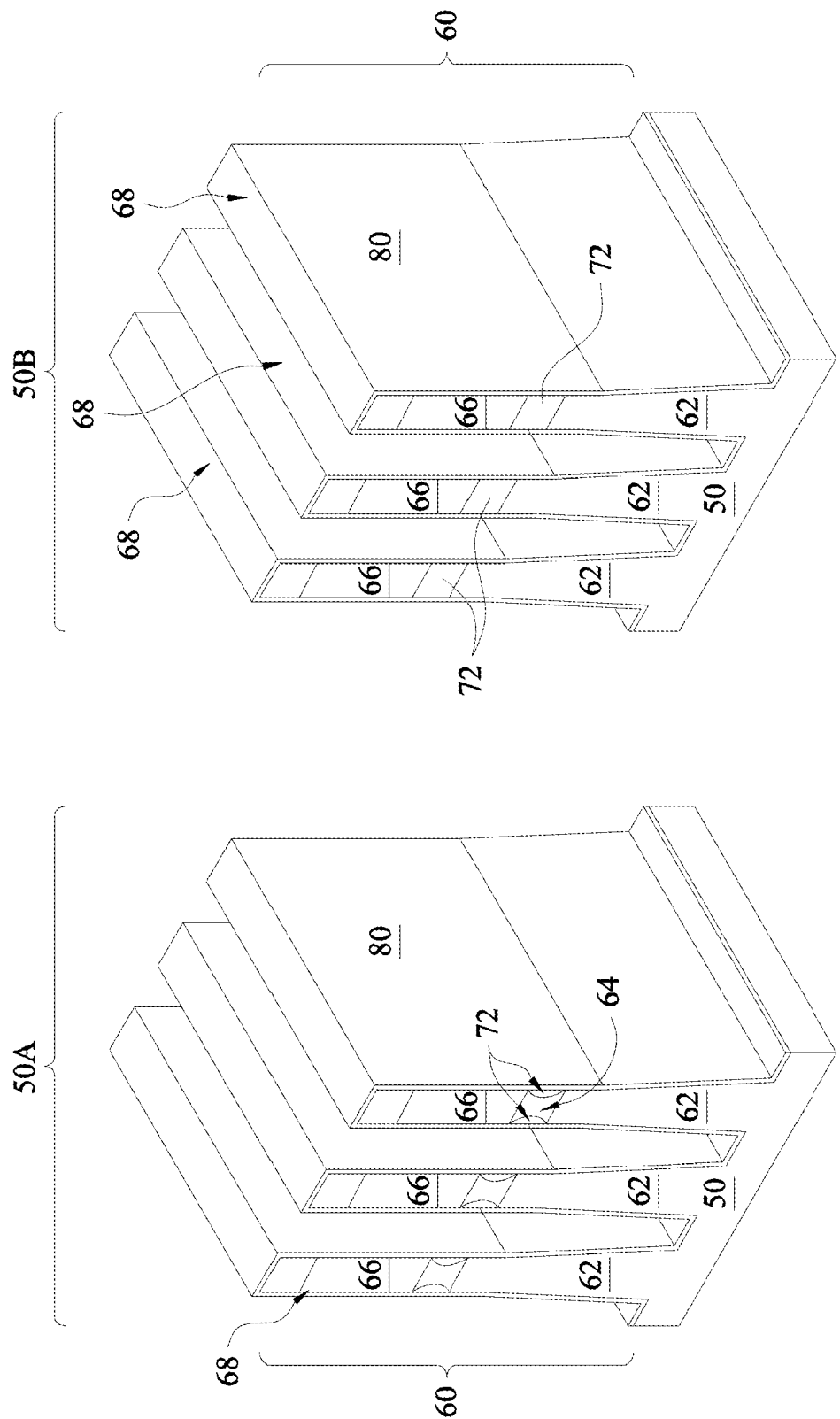
Figure 9B:
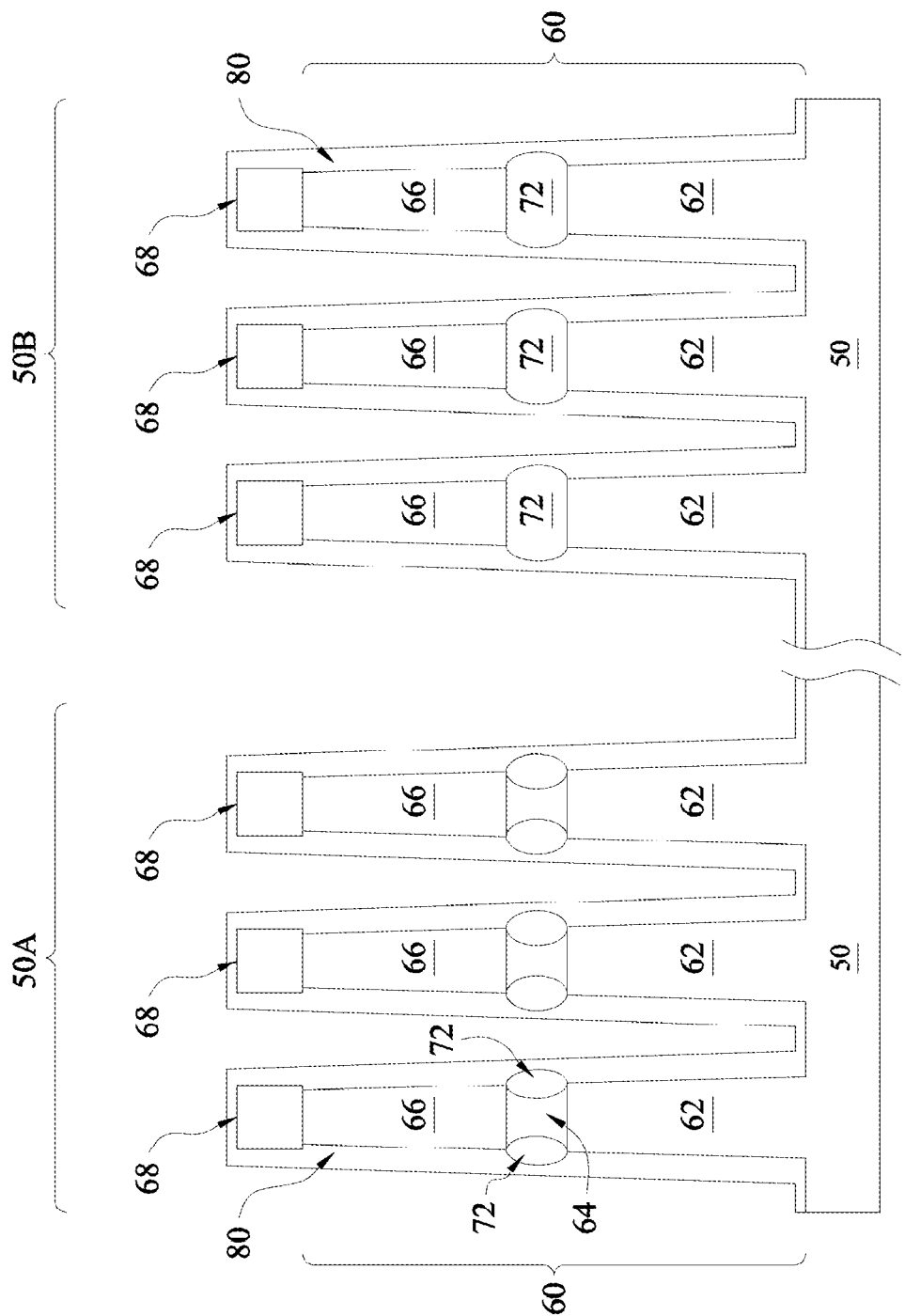

FIGS. 9A and 9B illustrate the formation of a liner layer 80 over the semiconductor strips 60 in the first region 50A and second region 50B (step 218). The liner layer 80 prevents further converting (e.g. oxidizing) of the SiGe layer 64 in the first region 50A during subsequent processing, such as curing and thermal processes. In some embodiments, the liner layer 80 may be formed of silicon nitride, silicon oxynitride, silicon carbide, silicon carbonitride, the like, or a combination thereof and may be formed by any suitable methods known in the art such as CVD, PECVD, the like, or a combination thereof. In some embodiments, the liner layer 80 is a conformal layer.

Figure 10A:
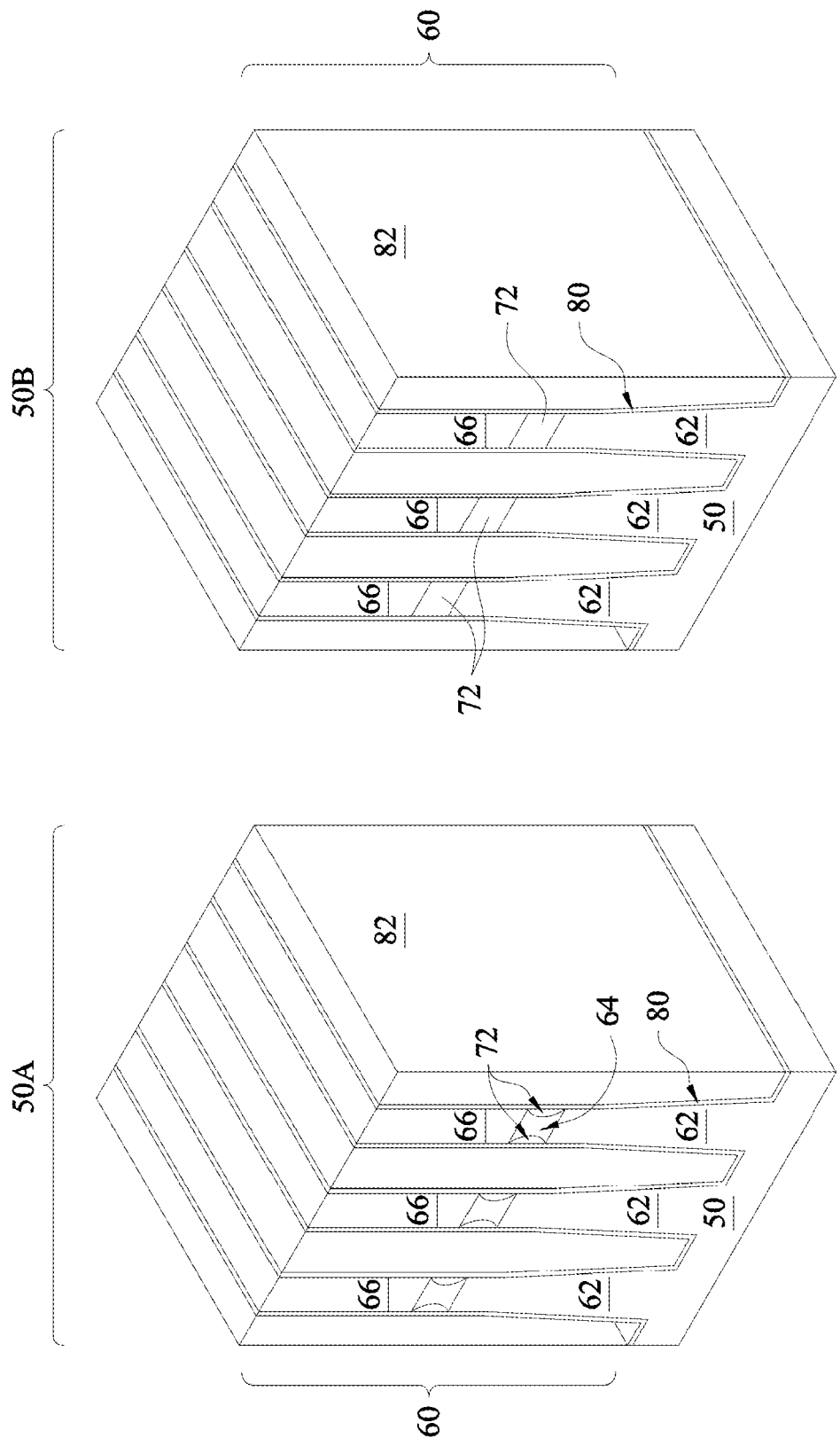
Figure 10B:
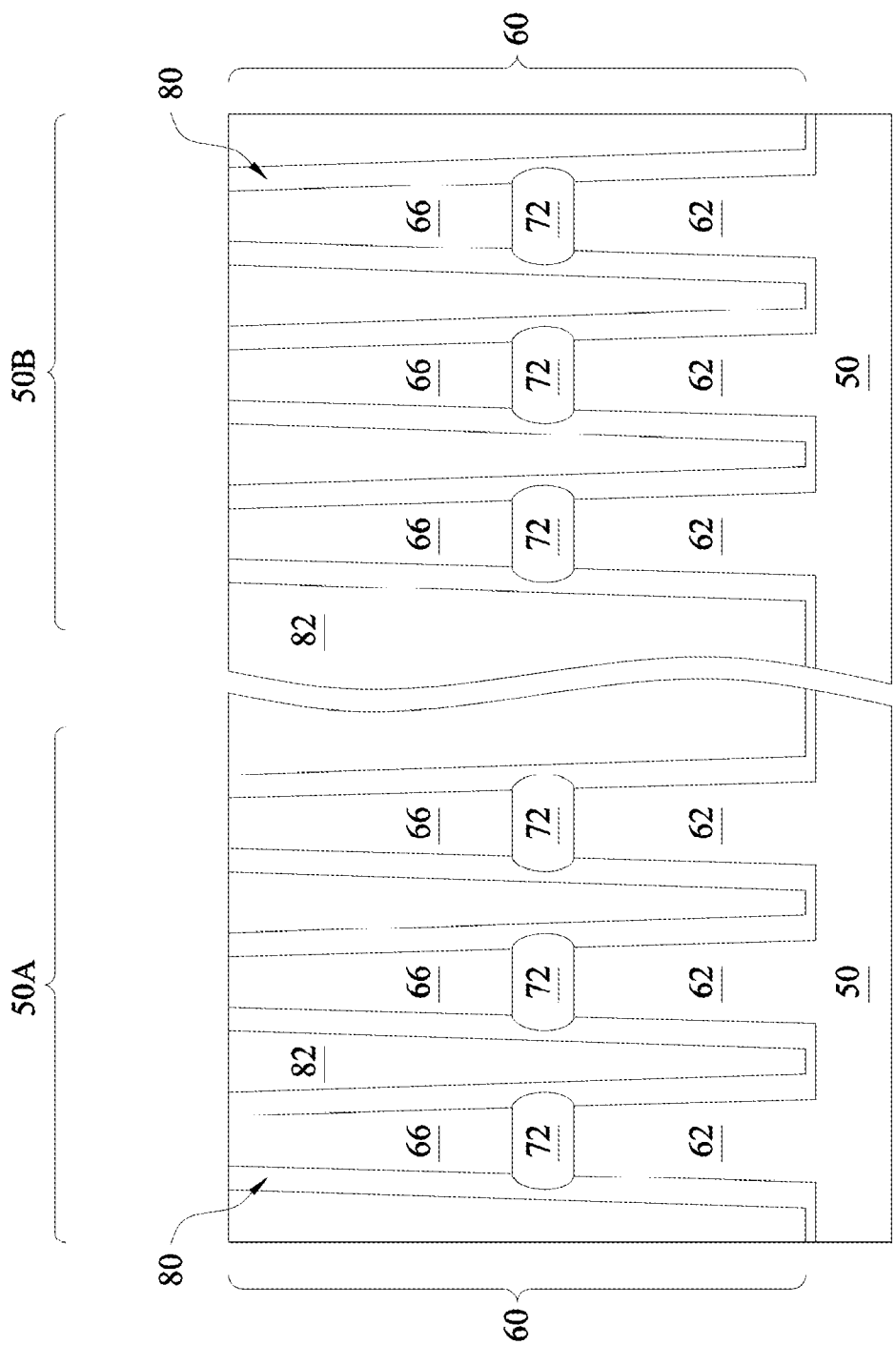

FIGS. 10A and 10B illustrate the formation of an insulation material between neighboring semiconductor strips 60 to form isolation regions 82 (step 220). The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIGS. 10A and 10B, a planarization process, such as a CMP, may remove any excess insulation material and liner layer 80 and form top surfaces of the isolation regions 82 and top surfaces of the semiconductor strips 60 that are coplanar (step 222).

Figure 11A:
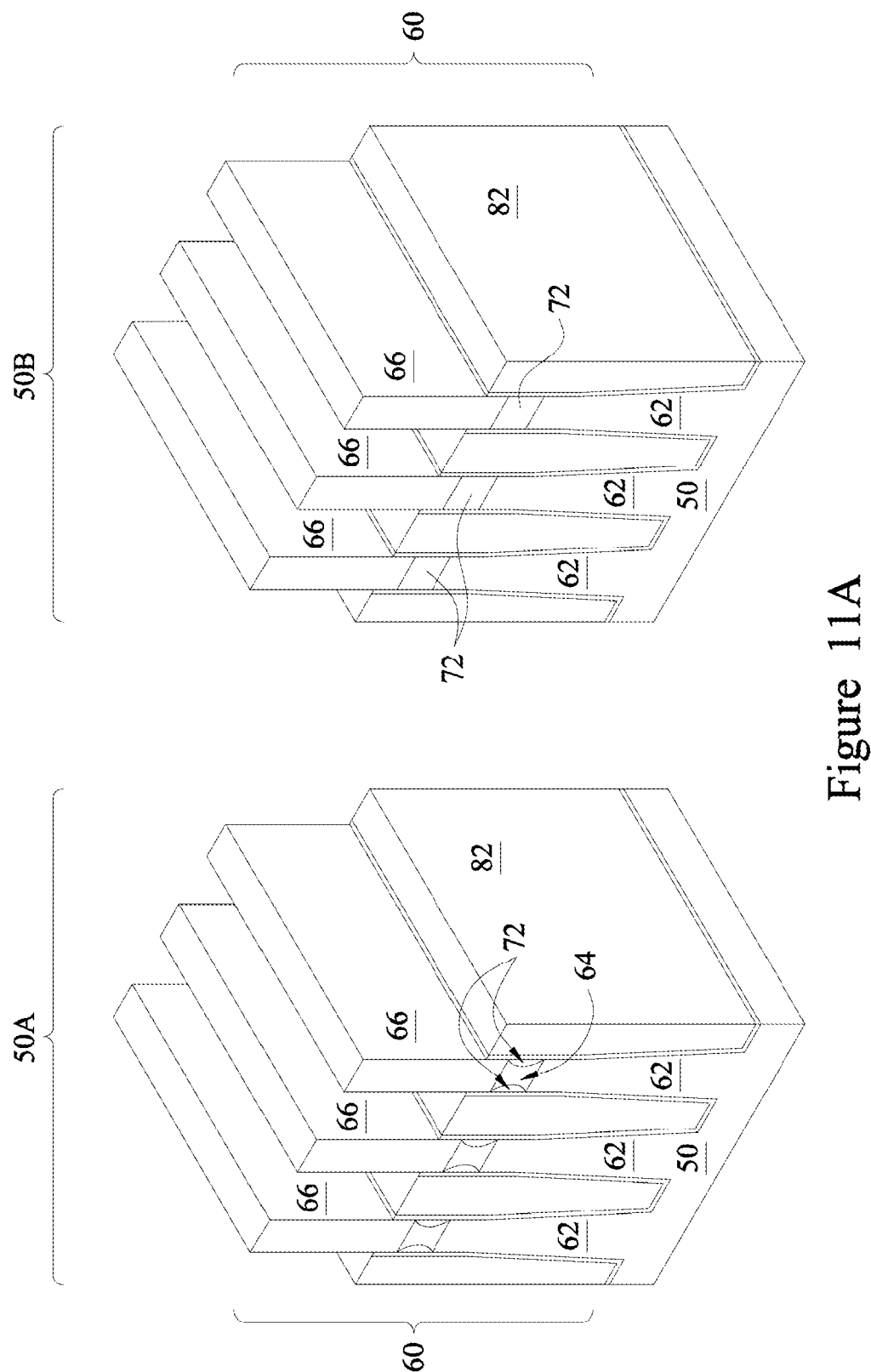
Figure 11B:
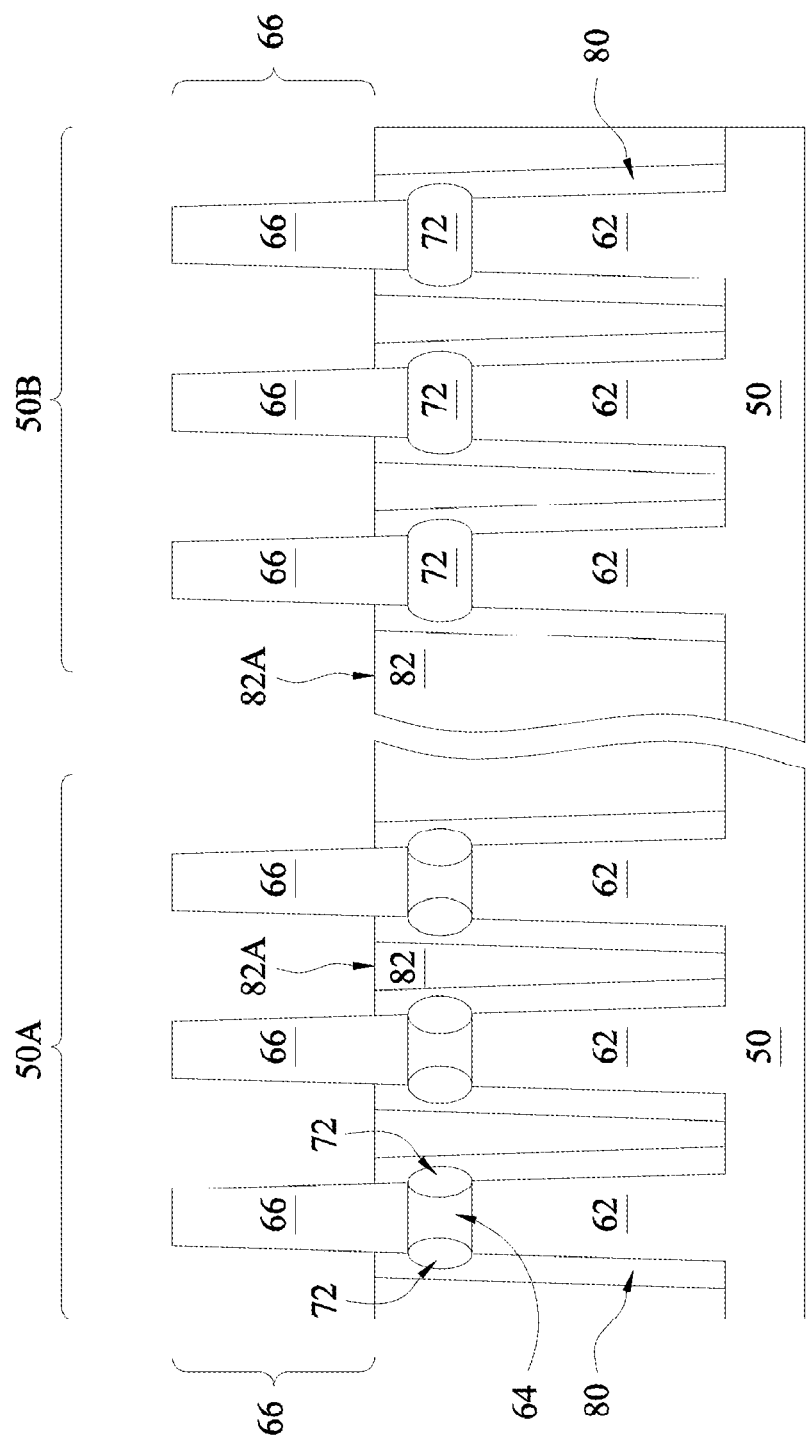

FIGS. 11A and 11B illustrate the recessing of the isolation regions 82 and the liner layer 80 (step 224), such as to form shallow trench isolation (STI) regions. The isolation regions 82 are recessed such that the semiconductor layers 66 of the semiconductor strips 60 protrude from between neighboring isolation regions 82 and form semiconductor fins. The semiconductor layers 66 may be referred to as semiconductor fins 66 hereinafter. As illustrated, the top surfaces of the isolation regions 82 are above top surfaces of the SiGe layers 64 and SiGe dielectric regions 72. In other embodiments, the top surfaces of the isolation regions 82 may be below top surfaces and above bottom surfaces of the SiGe layers 64 and SiGe dielectric regions 72, or the top surfaces of the isolation regions 82 may be below bottom surfaces of the SiGe layers 64 and SiGe dielectric regions 72. Further, the top surfaces of the isolation regions 82 may have a flat surface as illustrated, a convex surface, a concave surface (such as dishing), or a combination thereof. The top surfaces of the isolation regions 82 may be formed flat, convex, and/or concave by an appropriate etch. The isolation regions 82 may be recessed using an acceptable etching process, such as one that is selective to the material of the isolation regions 82. For example, a chemical oxide removal using a CERTAS® etch or an Applied Materials SICONI tool or dilute dHF acid may be used. In some embodiments, the isolation regions 82 and the liner layer 80 may be recessed in a same etch process, and in other embodiments, the isolation regions 82 and the liner layer 80 may be recessed in separate etch processes.

Figure 12B:
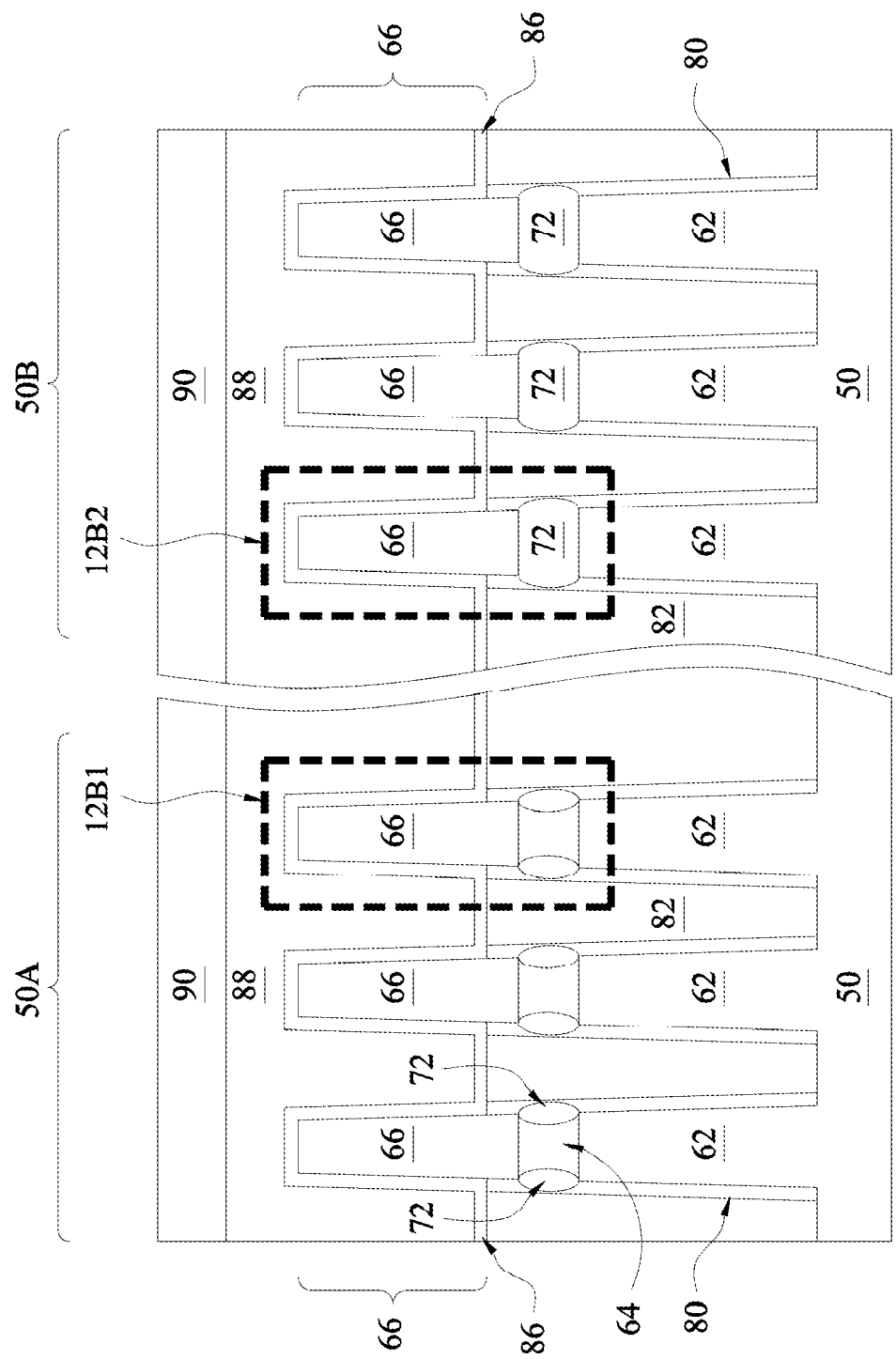

FIGS. 12A and 12B illustrate the formation of a gate structure over the semiconductor fins 66 (step 226). A dielectric layer (not shown) is formed on the semiconductor fins 66 and the isolation regions 82. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), PECVD, the like, or a combination thereof.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 90. The pattern of the mask 90 then may be transferred to the gate layer and dielectric layer by an acceptable etching technique to form gate 88 and gate dielectric 86. The gate 88 and gate dielectric 86 cover respective channel regions of the semiconductor fins 66. The gate 88 may also have a lengthwise direction substantially perpendicular to the lengthwise direction of respective semiconductor fins 66.

After the gate 88 and the gate dielectric 86 are formed, gate seal spacers 92 can be formed on exposed surfaces of gate 88 and mask 90. A thermal oxidation or a deposition followed by an anisotropic etch may form the gate seal spacers 92.

FIGS. 13B1 and 13B2 illustrate detailed views of portions of the structure the first region 50A and second region 50B in FIG. 12B, respectively. FIG. 13B1 illustrates a semiconductor fin 66 in the first region 50A extending above a top surface 82A of the isolation regions 82 by a height H1 as measured in a plane perpendicular to a major surface of the substrate 50 with the semiconductor fin having a width W1 as measured in a plane parallel to the major surface of the substrate 50. In some embodiments, the height H1 is in a range from about 20 nm to about 40 nm and the width W1 is in a range from about 9 nm to about 14 nm. The SiGe layer 64 is separated from a bottom of the semiconductor fin 66 by a distance D1 as measured in a plane perpendicular to the major surface of the substrate 50. In some embodiments, the distance D1 is in a range from about 3 nm to about 20 nm. The SiGe layer 64 has a thickness T1 as measured from a top surface to a bottom surface of the SiGe layer 64 in a plane perpendicular to the major surface of the substrate 50. In some embodiments, the thickness T1 is in a range from about 20 nm to about 90 nm. In some embodiments, the SiGe layer 64 has a germanium concentration in a range from about 30 percent to about 80 percent. The SiGe dielectric regions 72 have widths W2 as measured in a plane parallel to the major surface of the substrate 50. In some embodiments, the width W2 is in a range from about 3 nm to about 10 nm. The liner layer 80 may be formed to a thickness T2 as measured in a plane parallel to the major surface of the substrate 50. In some embodiments, the thickness T2 is in a range from 20 Angstroms to about 60 Angstroms.

FIG. 13B2 illustrates a semiconductor fin 66 in the second region 50B extending above the top surface 82A of the isolation regions 82 by a height H2 as measured in a plane perpendicular to a major surface of the substrate 50 with the semiconductor fin having a width W2 as measured in a plane parallel to the major surface of the substrate 50. In some embodiments, the height H2 is in a range from about 20 nm to about 40 nm and the width W2 is in a range from about 6 nm to about 10 nm. In some embodiments, the difference between the widths W1 and W2 of the semiconductor fins 66 in the first region 50A and the second region 50B, respectively, is in a range from about 2 nm to about 4 nm. The SiGe layer 64 is separated from a bottom of the semiconductor fin 66 by a distance D2 as measured in a plane perpendicular to the major surface of the substrate 50. In some embodiments, the distance D2 is in a range from about 3 nm to about 20 nm. The SiGe dielectric region 72 has a width W4 as measured in a plane parallel to the major surface of the substrate 50. In some embodiments, the width W4 is in a range from about 8 nm to about 16 nm. The liner layer 80 may be formed to a thickness T3 as measured in a plane parallel to the major surface of the substrate 50. In some embodiments, the thickness T3 is in a range from 20 Angstroms to about 60 Angstroms.

FIGS. 14A, 14B, and 14C illustrate the removal the semiconductor fins 66 outside of the gate structure (step 228) and the formation of source/drain regions 96 (step 230). The gate structure may be used as a mask during the removal of the semiconductor fins 66. In some embodiments, the SiGe layer 64 and SiGe dielectric regions 72 are not removed at all during this process. In other embodiments, some portions of the SiGe layer 64 and SiGe dielectric regions 72 not under the gate structure are removed. The removal of the semiconductor fins 66 may be performed by etching using any acceptable etch process, such as a RIE, NBE, tetramethylammonium hydroxide (TMAH), ammonium hydroxide ($NH_4OH$), a wet etchant capable of etching silicon with good etch selectivity between silicon and a material of the isolation regions 82, the like, or a combination thereof. The etch may be anisotropic.

After the removal of portions of the semiconductor fins 66, the source/drain regions 96 are formed (step 230). The source/drain regions 96 are formed by epitaxially growing a material from the remaining semiconductor fins 66, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 14A and 14C, the source/drain regions 96 are grown both vertically and horizontally to form facets.

In the first region 50A in which the resulting FinFET is an n-type FinFET, source/drain regions 96 comprise silicon carbide (SiC), silicon phosphorous (SiP), phosphorous-doped silicon carbon (SiCP), or the like. In the second region 50B in which the resulting FinFET is a p-type FinFET, source/drain regions 96 comprise SiGe, and a p-type impurity such as boron or indium.

The epitaxial source/drain regions 96 and/or may be implanted with dopants to form source/drain regions followed by an anneal. The implanting process may include forming and patterning masks such as a photoresist to cover the regions of the FinFET that are to be protected from the implanting process. The source/drain regions 96 may have an impurity concentration of between about $10^{19}$ cm$^{-3}$ and about $10^{21}$ cm$^{-3}$. In some embodiments, the epitaxial source/drain regions 96 may be in situ doped during growth.

Subsequent processing of the FinFET device may be performed, such as the formation of one or more interlayer dielectrics and formation of contacts. These processes will be discussed below in reference to FIGS. 18A-21.

Figure 17:
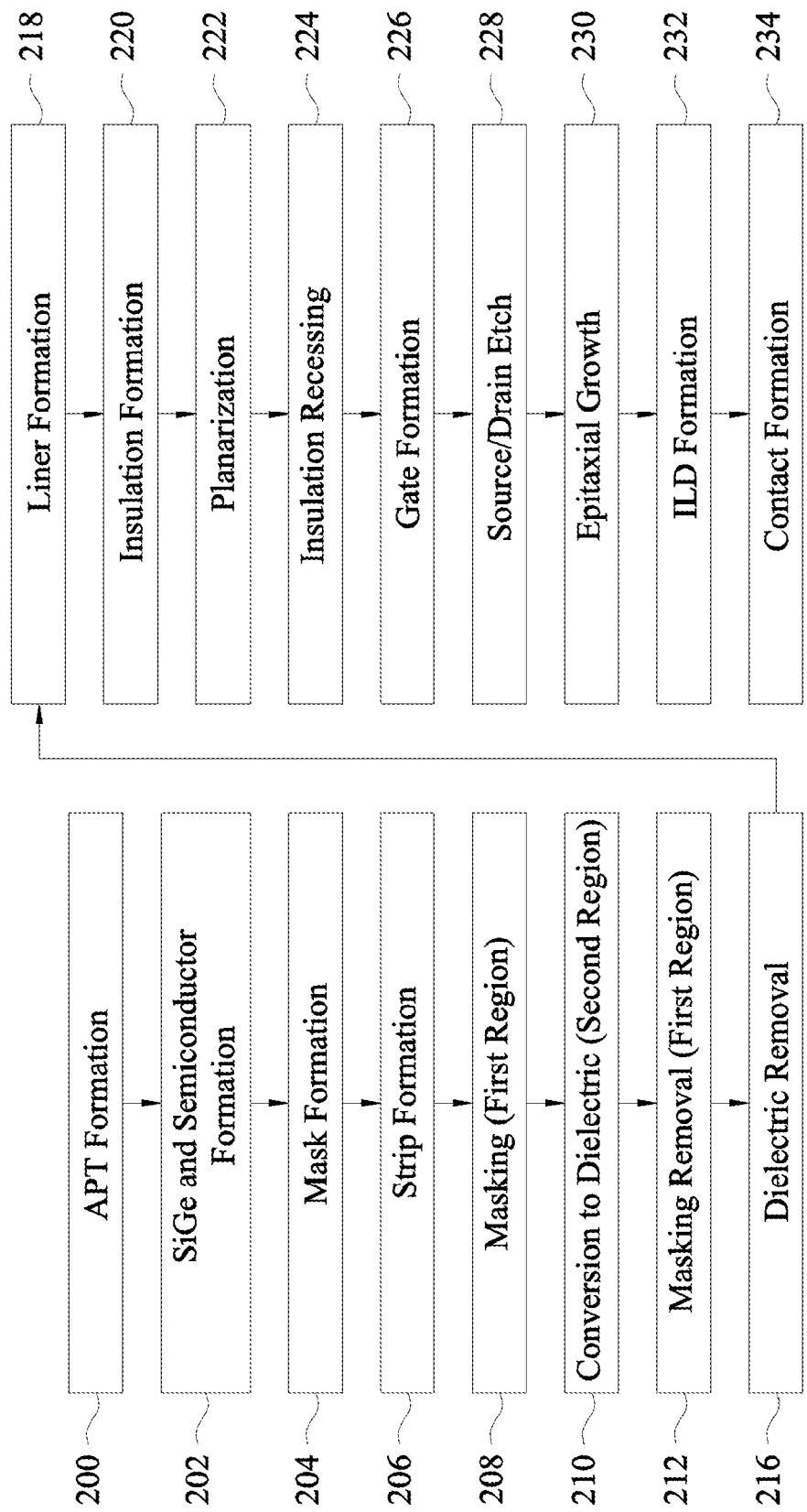
FIG. 17 is a process flow of a process in accordance with some embodiments.

FIGS. 16B1 and 16B2 are cross-sectional views of an intermediate stage in the manufacturing of FinFETs in accordance with another exemplary embodiment, and FIG. 17 is a process flow of the process shown in FIGS. 16B1 and 16B2. FIGS. 16B1 and 16B2 detailed cross-sectional views similar to FIGS. 13B1 and 13B2 except that in this embodiment the semiconductor strips 60 in the first region 50A of the substrate (portion illustrated in FIG. 16B1) were not subjected to a conversion to dielectric process. In other words, the SiGe layer 64 in the first region 50A contains substantially no oxide. Details regarding this embodiment that are similar to those for the previously described embodiment will not be repeated herein.

Processing first proceeds as discussed with respect to FIGS. 2 through 6B and steps 200 through 212, except that the second conversion to dielectric step (step 214 in FIG. 15) is not performed when the first region 50A of the substrate is exposed. For example, the second conversion to dielectric step is skipped altogether or it may be performed at a similar time as the first conversion to dielectric step in step 210. After the masking is removed in step 212, processing proceeds as discussed with respect to FIGS. 8A through 14C and steps 216 through 234. FIGS. 16B1 and 16B2 illustrate detailed views of the semiconductor strips 60 in the first region 50A and the second region 50B, respectively, in accordance with this embodiment.

The dimensions and properties of FIGS. 16B1 and 16B2 are similar to those discussed with respect to FIGS. 13B1 and 13B2, respectively, except that FIG. 16B1 does not have a SiGe dielectric region 72, and thus, those dimensions and properties are not present in the embodiment of FIG. 16B1.

Figure 19A:
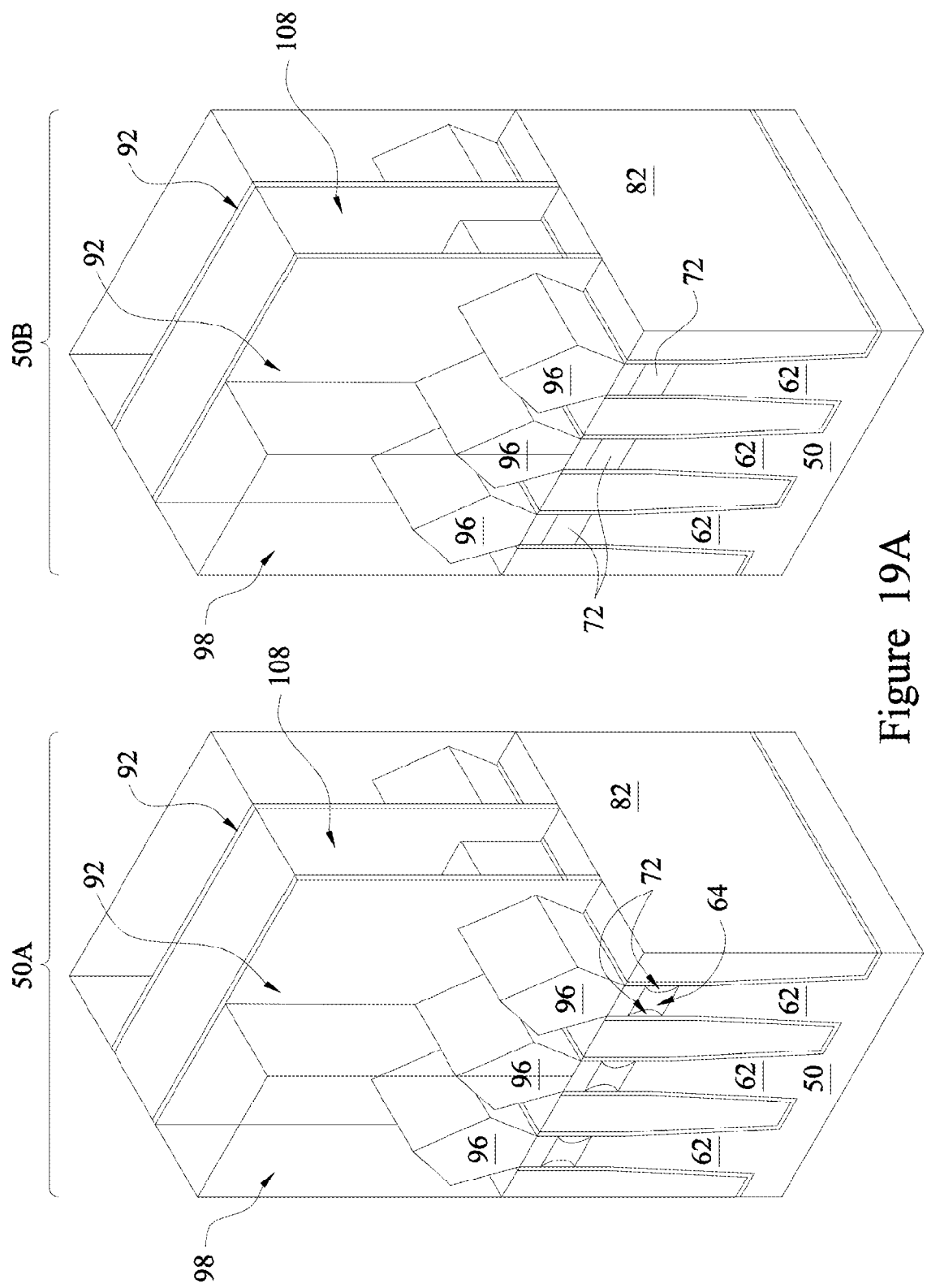
Figure 19B:
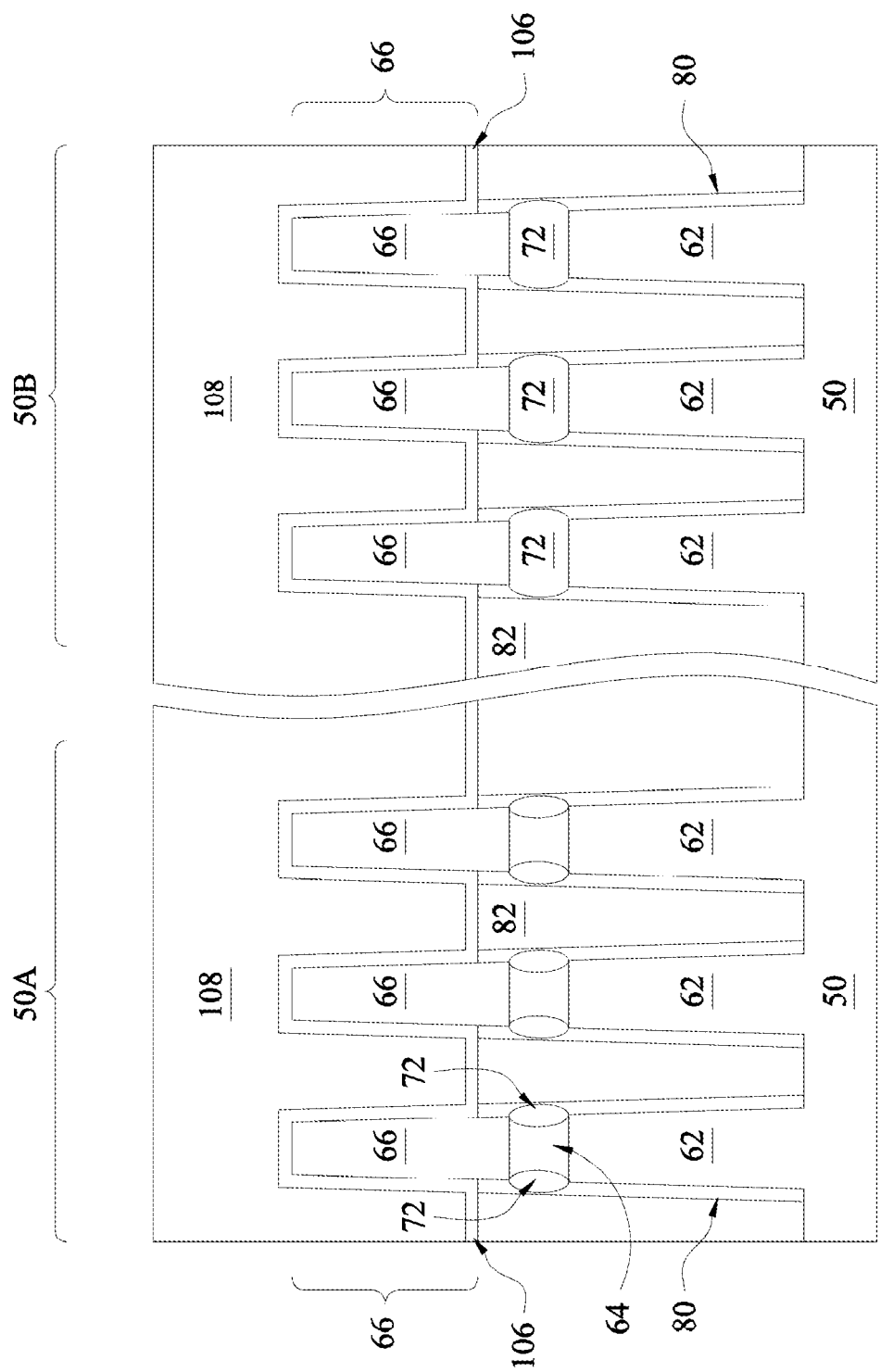
Figure 19C:
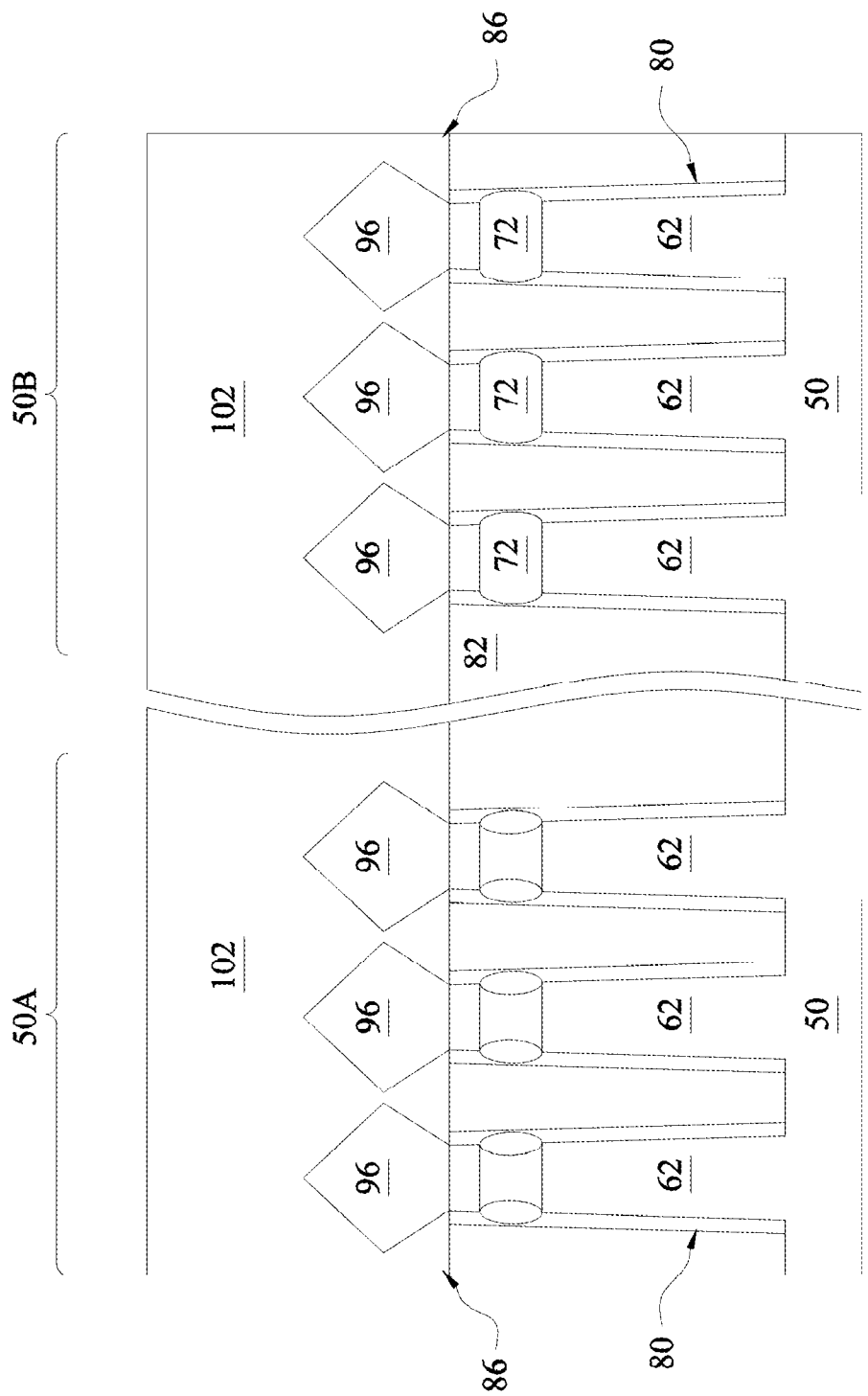
Figure 20:
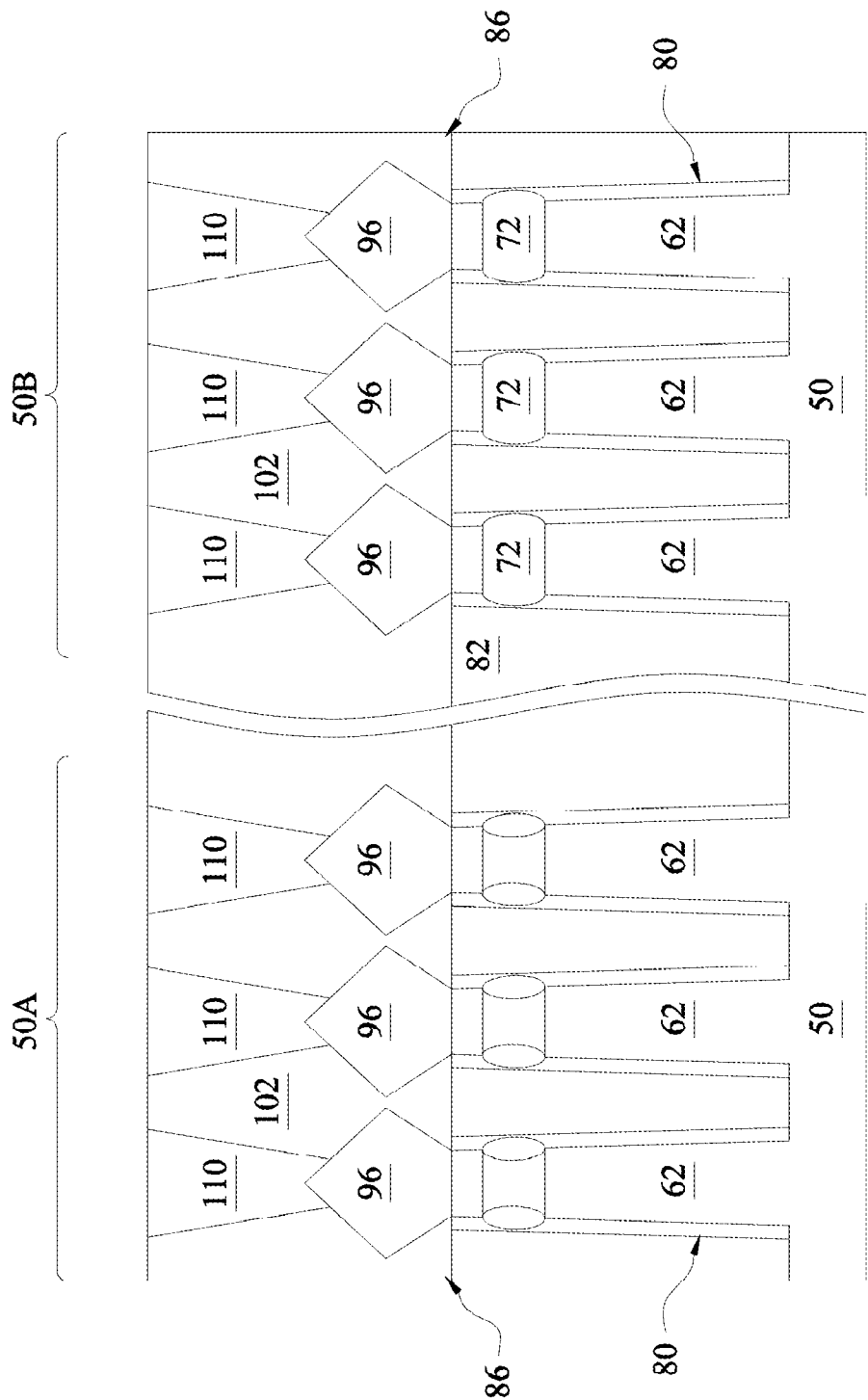
Figure 21:
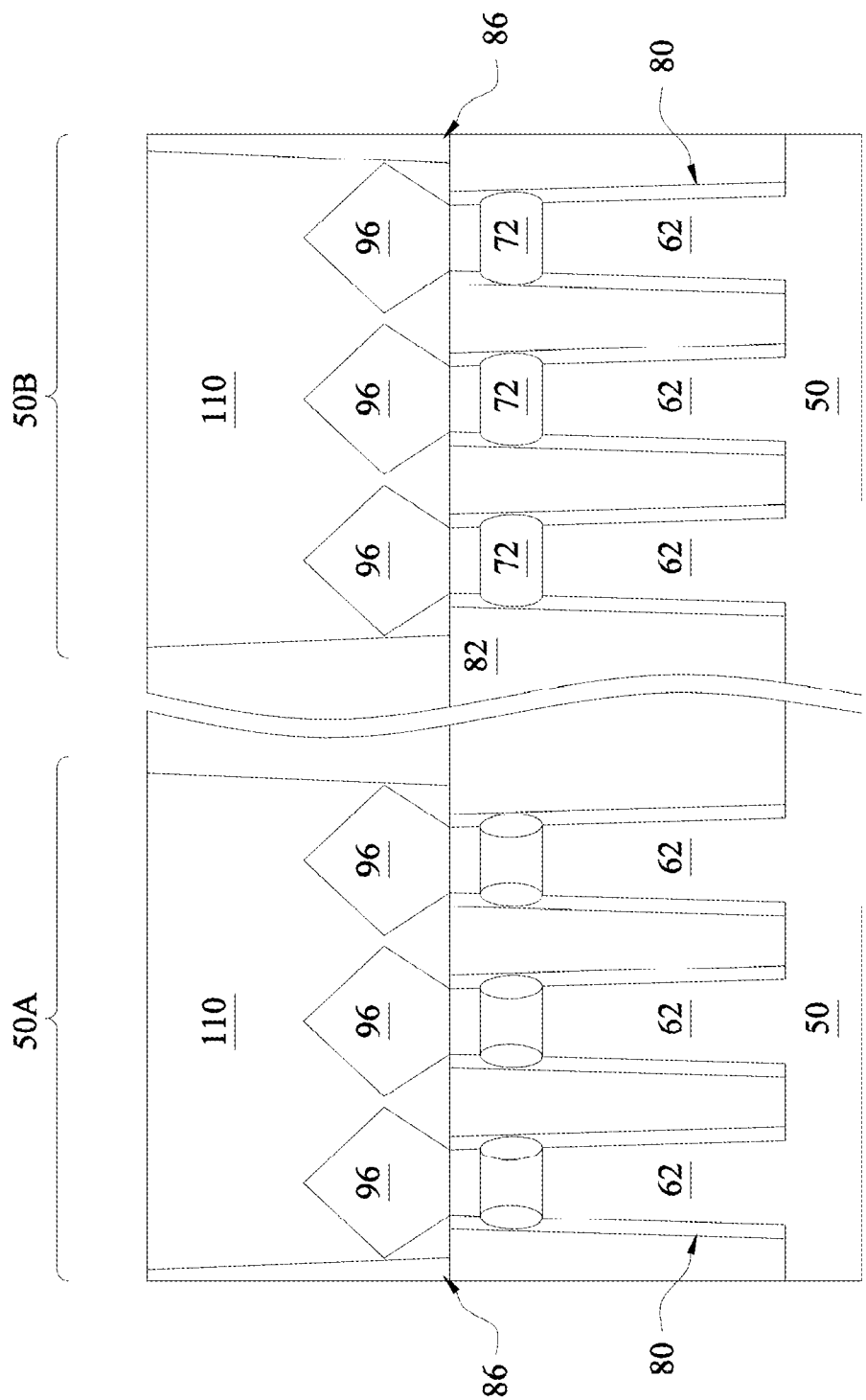
Figure 22:
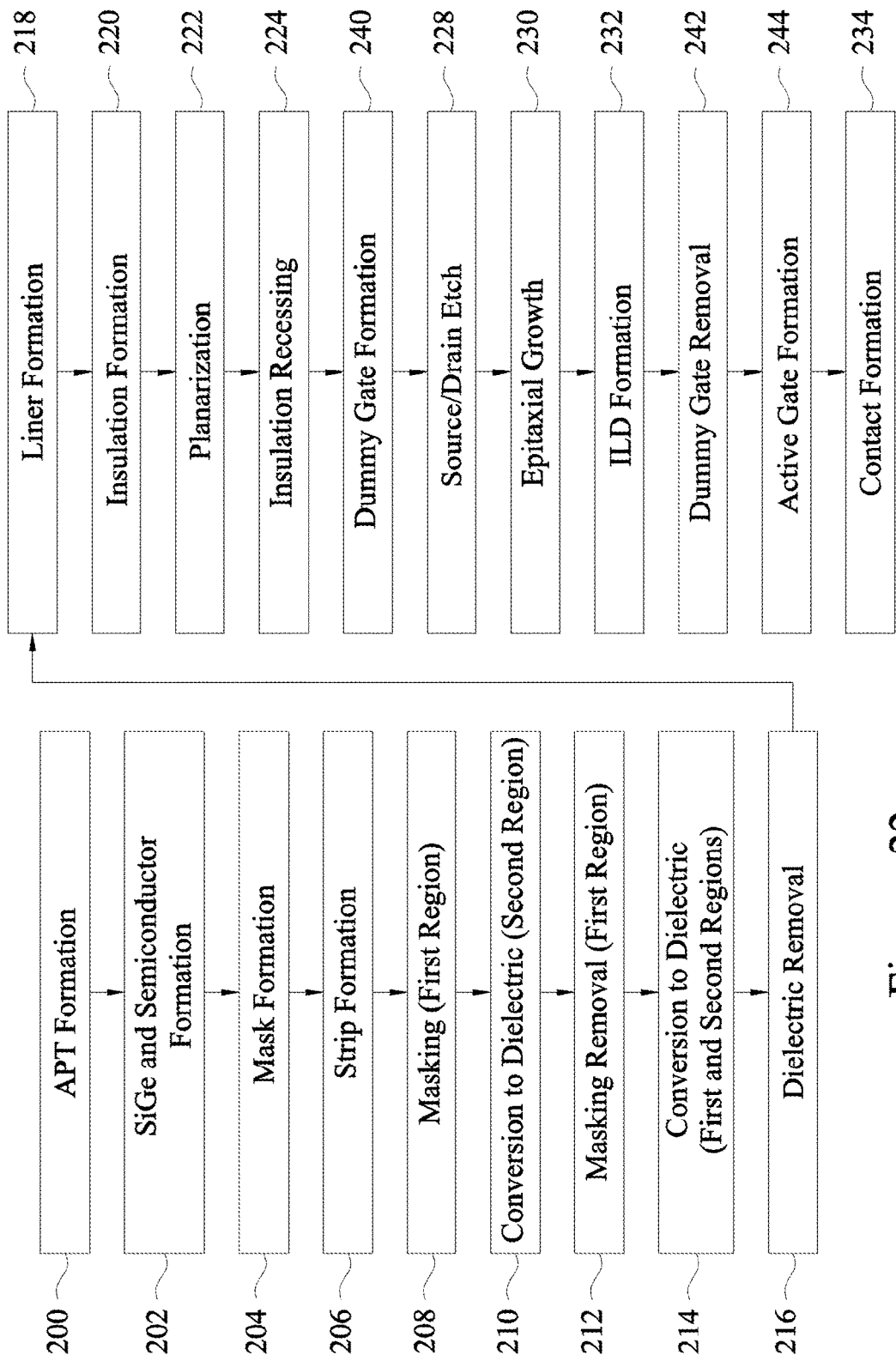
FIG. 22 is a process flow of a process in accordance with some embodiments.

FIGS. 18A-18C, 19A-19C, 20, and 21 are cross-sectional views of intermediate stages in the manufacturing of FinFETs in accordance with another exemplary embodiment, and FIG. 22 is a process flow of the process shown in FIGS. 18A-18C, 19A-19C, 20, and 21. FIGS. 18A through 21 illustrate a FinFET similar to FinFET 30 in FIG. 1, except for multiple FinFETs. In FIGS. 18A through 19C, figures ending with an "A" designation are three-dimensional views; figures ending with a "B" designation illustrate cross-section B-B; and figures ending with a "C" designation illustrate cross-section C-C. FIGS. 21 and 22 illustrate cross-section C-C.

This embodiment is similar to the embodiment described above in FIGS. 2 through 14C except that this embodiment describes a gate-last process (sometimes referred to as a replacement-gate process) whereas the previous embodiment described a gate-first process. Details regarding this embodiment that are similar to those for the previously described embodiment will not be repeated herein.

Figure 18A:
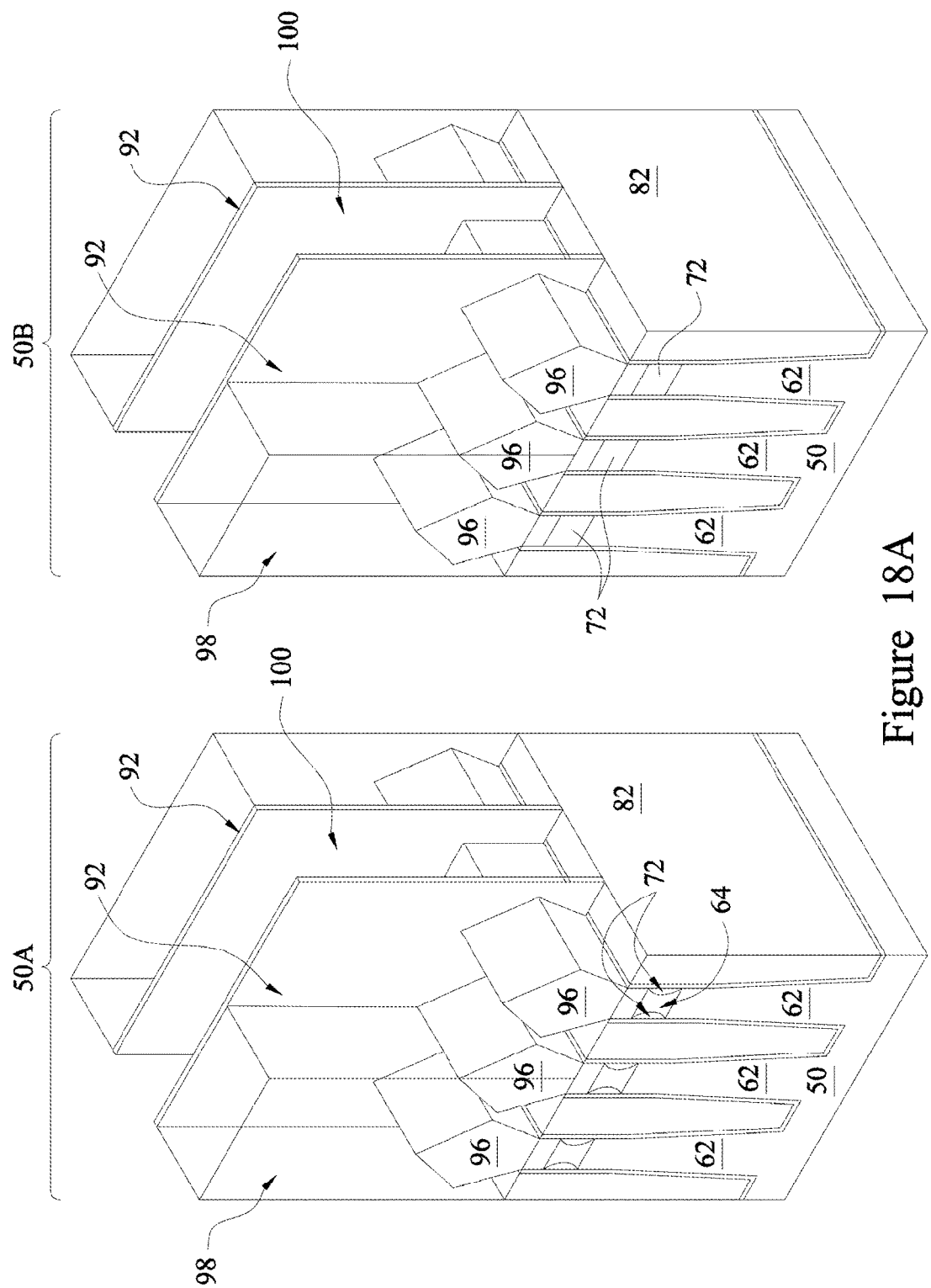
FIGS. 18A-18C, 19A-19C, 20, and 21 are cross-sectional views of intermediate stages in the manufacturing of FinFETs in accordance with some embodiments.
Figure 18B:
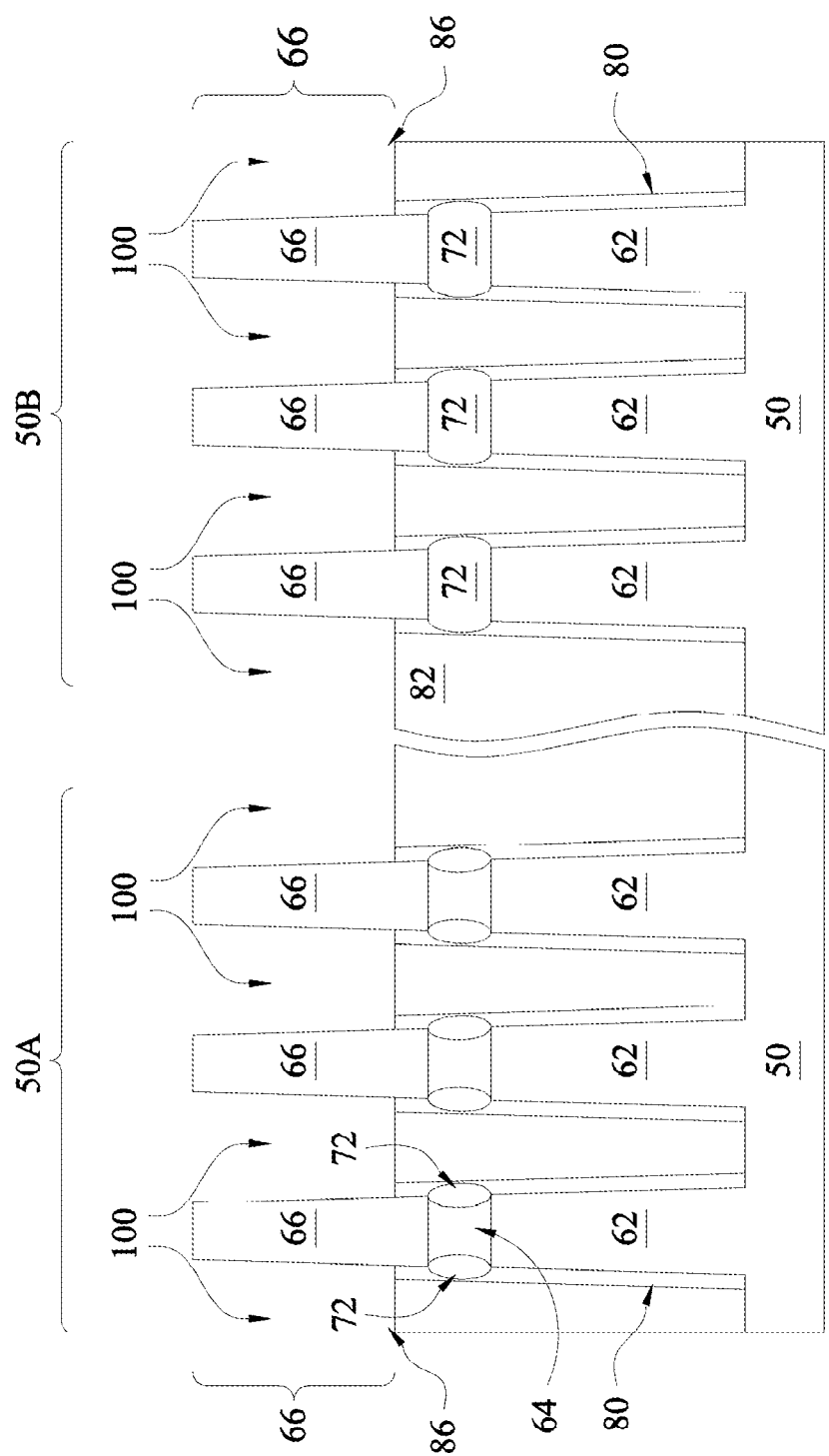
Figure 18C:
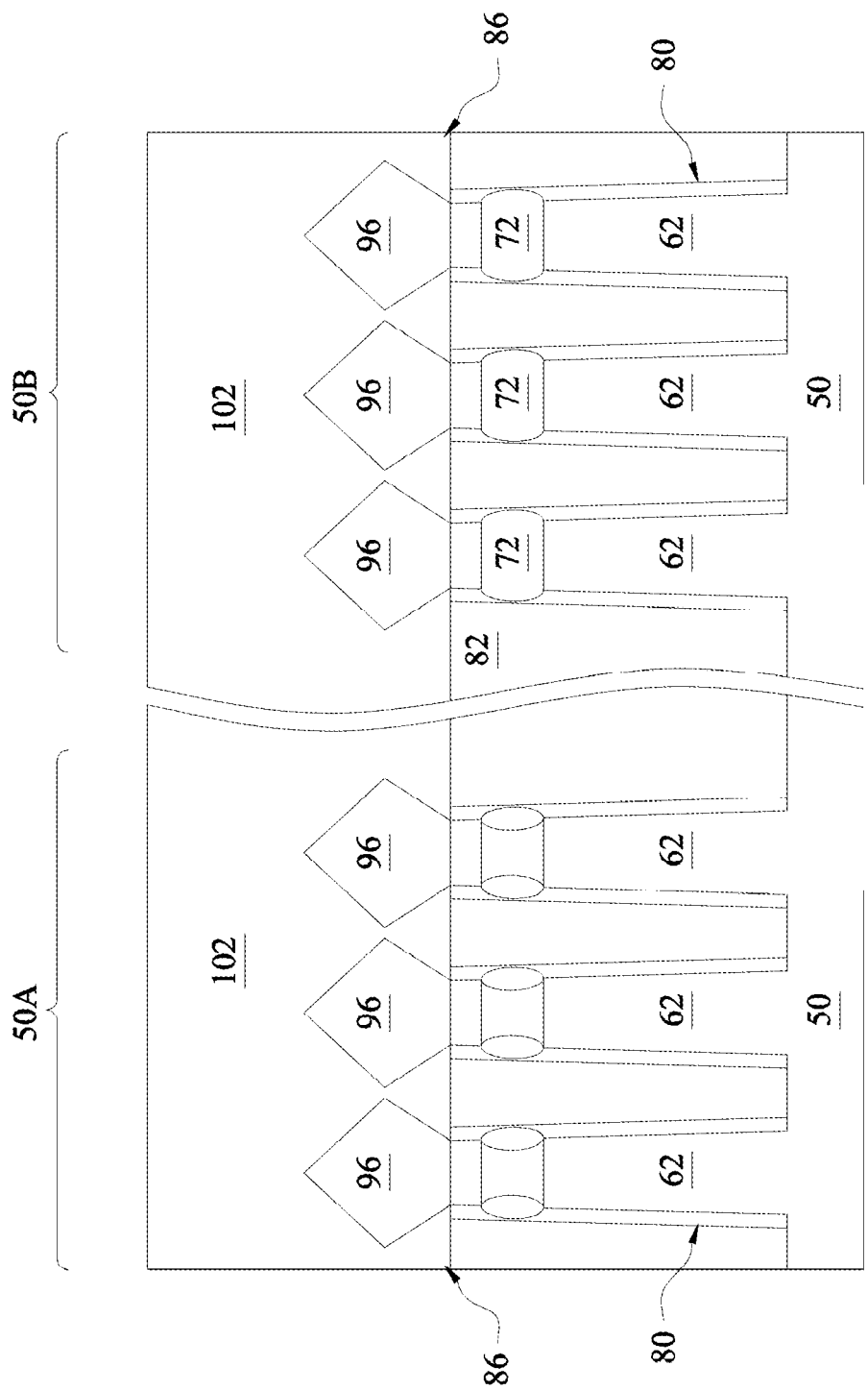

Processing first proceeds as discussed with respect to FIGS. 2 through 14C and steps 200 through 230, except that gate 88 is a dummy gate and gate dielectric 86 is a dummy gate dielectric (step 240 in FIG. 22). In FIGS. 18A, 18B, and 18C, an interlayer dielectric (ILD) 98 is deposited over the structure illustrated in FIGS. 14A, 14B, and 14C (step 232). The ILD 98 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

As further illustrated in FIGS. 18A, 18B, and 18C, a planarization process, such as a CMP, may be performed to level the top surface of ILD 98 with the top surfaces of the dummy gate 88. The CMP may also remove the mask 90 on the dummy gate 88. Accordingly, top surfaces of the dummy gate 88 are exposed through the ILD 98.

As further illustrated in FIGS. 18A, 18B, and 18C, the dummy gate 88, optionally gate seal spacers 92, and portions of the dummy gate dielectric 86 directly underlying the dummy gate 88 are removed in an etching step(s), so that recess(es) 100 are formed (step 242). The recess(es) 100 expose channel regions of the semiconductor fins 66. The channel regions are disposed between neighboring pairs of epitaxial source/drain regions 96. During the removal, the dummy gate dielectric 86 may be used as an etch stop layer when the dummy gate 88 is etched. The dummy gate dielectric 86 and gate seal spacers 92 may then be removed after the removal of the dummy gate 88.

In FIGS. 19A, 19B, and 19C, gate dielectric 106 and gate electrode 108 are formed for replacement gates (step 244). The gate dielectric 106 is deposited conformally in recess (es) 100, such as on the top surfaces and the sidewalls of the semiconductor fins 66 and on sidewalls of the gate seal spacers 92 (if present), on sidewalls of ILD 98 if gate seal spacers 92 are not present, and on a top surface of the ILD 98. In accordance with some embodiments, the gate dielectric 106 may be formed of silicon oxide, silicon nitride, or multilayers thereof. In other embodiments, the gate dielectric 106 may be formed of a high-k dielectric material, and in these embodiments, the gate dielectric 106 may have a k value greater than about 7.0, and may include a metal oxide or a silicate of Hf, Al, Zr, La, Mg, Ba, Ti, Pb, and combinations thereof. The formation methods of gate dielectric 106 may include MBD, ALD, PECVD, and the like.

Next, the gate electrode 108 is deposited over the gate dielectric 106 and fill the remaining portions of the recess(es) 100. The gate electrode 108 may be formed of a metal-containing material such as TiN, TaN, TaC, Co, Ru, Al, combinations thereof, or multi-layers thereof. After the filling of gate electrode 108, a planarization process, such as a CMP, may be performed to remove the excess portions the gate dielectric 106 and the material of gate electrode 108, which excess portions are over the top surface of ILD 98. The resulting remaining portions of material of the gate electrode 108 and the gate dielectric 106 thus form replacement gates of the resulting FinFETs.

In FIGS. 20 and 21, contacts 110 are formed through ILD 98 (step 234). FIG. 20 illustrates an embodiment where separate contacts 110 to each of the source/drain regions 96 and FIG. 21 illustrates an embodiment where a single contact 110 contacts multiple (if not all) source/drain regions 96 in the FinFET. Openings for contacts 110 are formed through the ILD 98. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 98. The remaining liner and conductive material form contacts 110 in the openings. An anneal process may be performed to form a silicide at the interface between the source/drain regions 96 and the contacts 110. The contacts 110 are physically and electrically coupled to the source/drain regions 96.

Although not explicitly shown, a person having ordinary skill in the art will readily understand that further processing steps may be performed on the structure in FIGS. 19A, 19B, 19C, 20, and 21. For example, various inter-metal dielectrics (IMD) and their corresponding metallizations may be formed over ILD 98. Further, contacts to the gate electrode 108 may be formed through overlying dielectric layers.

Figure 23:
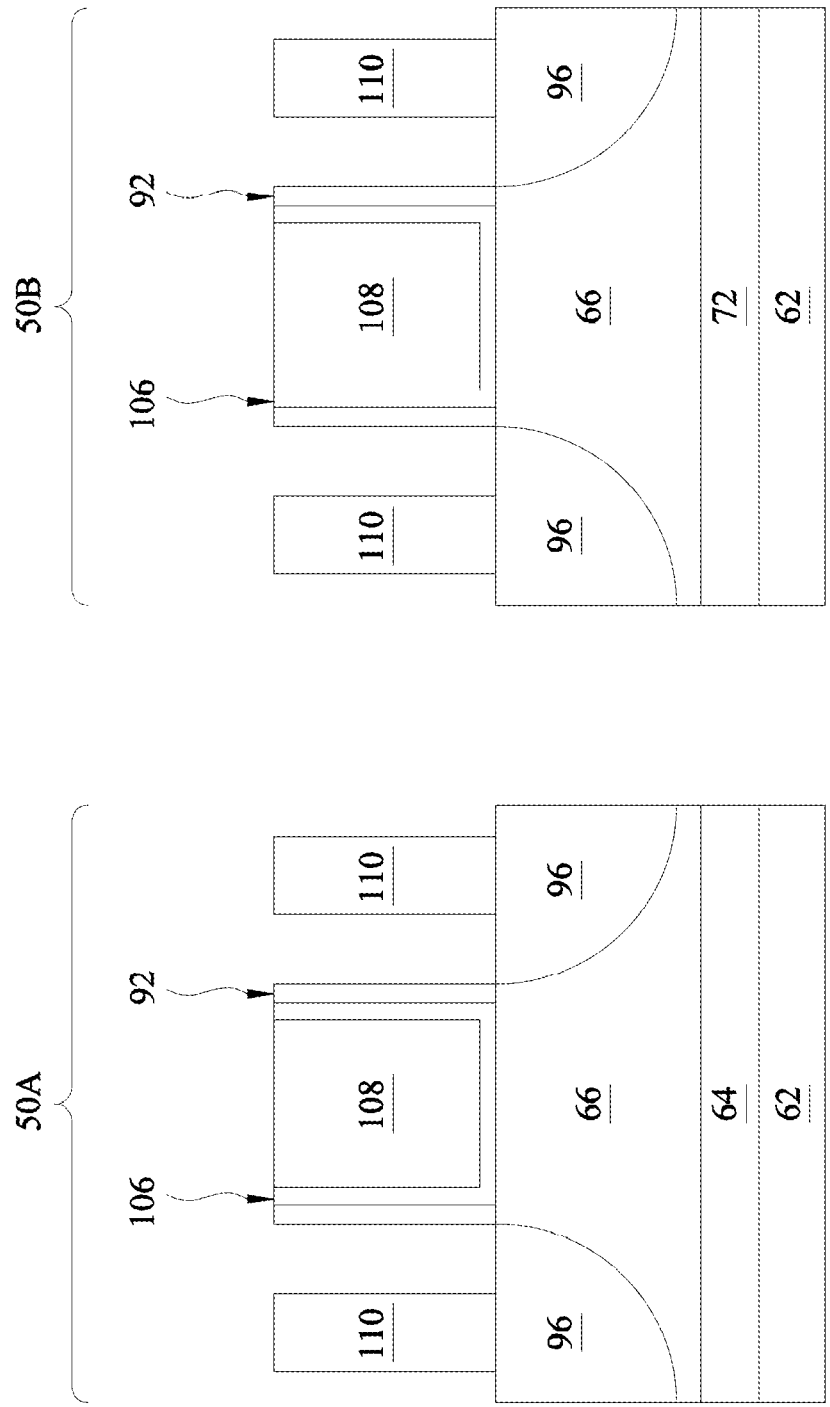
FIGS. 23 and 24 are cross-sectional views of aspects of structures in accordance with some embodiments.
Figure 24:
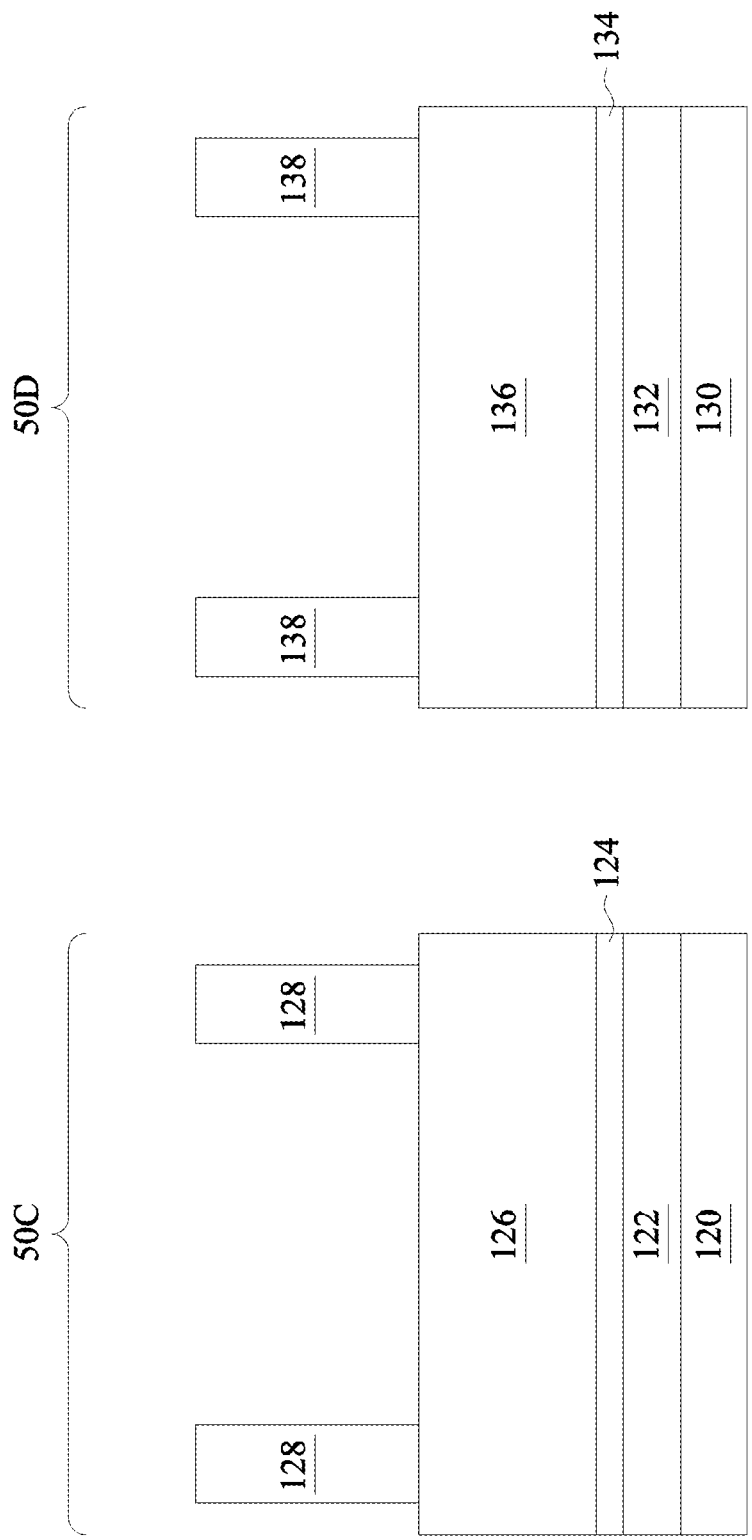

FIGS. 23 and 24 illustrate cross-section D-D of FIG. 1 with aspects of structures in accordance with some embodiments. FIG. 23 illustrates cross-sections along the semiconductor fins 66 of the structure illustrated in FIGS. 19A-C.

FIG. 24 illustrates a third region 50C and a fourth region 50D of the substrate 50 in accordance with some embodiments. The third region 50C may be a contact pickup region of the substrate 50, and specifically, in some embodiments, third region 50C is an n-type or p-type contact region. The structures 120, 122, 124, and 128 correspond to structures 62, 64, 66, and 110, respectively of the embodiments discussed above, and may be formed of similar materials and by similar processes. The contact region 126 may be doped with either n-type impurities or p-type impurities as appropriate for the device design, and may be formed in a similar manner as the source/drain regions 96. In some embodiments, the contact region 126 will be doped with a same type of impurity (e.g. n-type or p-type) as the layer 124. The SiGe layer 122 may be similar to the SiGe layer 64 discussed above.

The fourth region 50D may be a passive device region of the substrate 50, and specifically, in some embodiments, fourth region 50D is a diode region. The structures 130, 132, 134, and 138 correspond to structures 62, 64, 66, and 110, respectively of the embodiments discussed above, and may be formed of similar materials and by similar processes. The doped region 136 may be doped with either n-type impurities or p-type impurities as appropriate for the device design, and may be formed in a similar manner as the source/drain regions 96. In some embodiments, the region 136 will be doped with an opposite type of impurity (e.g. n-type or p-type) as the layer 124 to form a diode structure. The SiGe layer 122 may be similar to the SiGe layer 64 discussed above.

Embodiments may achieve advantages. For example, the present disclosure is a semiconductor device and method of forming the same to provide a simple and cost-effective process flow to achieve an undoped channel in a FinFET for device enhancement. In addition, this simple and cost-effective process flow may achieve a channel on insulator scheme (sometimes referred to as a channel on oxide). In particular, embodiments such as those disclosed below include different amounts of oxidation of a semiconductor layer for different regions of the device to achieve performance improvements and enhancements. For example, in a first region containing n-type devices, such as NMOS transistors, an epitaxial semiconductor layer (e.g. SiGe layer) is partially oxidized or not oxidized at all to achieve tensile strain enhancement in the first region, while in a second region containing p-type devices, such as PMOS transistors, an epitaxial semiconductor layer (e.g. SiGe layer) is fully oxidized to avoid the tensile strain penalty in the second region. Further other regions of the device, such as contact pickup areas and/or passive device areas, an epitaxial semiconductor layer (e.g. SiGe layer) can be partially oxidized or not oxidized to enhance the performance of these regions as well. Further, with the disclosed process, epitaxial portions of the fins are epitaxially grown as blanket layers which have fewer defects and are generally a higher quality semiconductor structure than structures epitaxially grown in trenches/recesses.

An embodiment is a method including forming a first fin and a second fin on a substrate, the first fin and the second fin each including a first crystalline semiconductor material on a substrate and a second crystalline semiconductor material above the first crystalline semiconductor material. Converting the first crystalline semiconductor material in the second fin to a dielectric material, wherein after the converting step, at least a portion of the first crystalline semiconductor material in the first fin remains unconverted. Forming gate structures over the first fin and the second fin, and forming source/drain regions on opposing sides of the gate structures.

Another embodiment is a method including epitaxially growing a first crystalline semiconductor material on a substrate, epitaxially growing a second crystalline semiconductor material above the first crystalline semiconductor material, and patterning the first crystalline semiconductor material and the second crystalline semiconductor material to form a first fin and second fin on the substrate. The method further includes oxidizing at least a portion of the first crystalline semiconductor material in the first fin and all of the first crystalline semiconductor material in the second fin to form a first oxide material, and oxidizing at least a portion of the second crystalline semiconductor material in the first fin and the second fin to form a second oxide material, wherein after the oxidizing of the first fin and the second fin, a portion of the first crystalline semiconductor material in the first fin is not oxidized. The method further includes removing at least a portion of the second oxide material, forming isolation regions on the substrate and surrounding at least lower portions of the first fin and the second fin, forming gate structures over the first fin, the second fin, and the isolation regions, and forming source/drain regions on opposing sides of the gate structures.

A further embodiment is a structure including a first fin and a second fin on a substrate. The first fin including a first epitaxial portion, and a second epitaxial portion directly underlying the first epitaxial portion, the second epitaxial portion having a different material composition than the first epitaxial portion. The second fin including a third epitaxial portion, and a first dielectric region directly underlying the third epitaxial portion. The structure further including and isolation regions in the substrate and on opposing sides of the first fin and the second fin, at least the first epitaxial portion of the first fin and the third epitaxial portion of the second fin protruding from between the isolation regions, the first dielectric region having a different material composition than the isolation regions, and gate structures along sidewalls and over an upper surfaces of the first fin and the second fin, the gate structures defining a channel region in the first epitaxial portion and the third epitaxial portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin and a second fin, the first fin and the second fin each comprising a substrate semiconductor material, a first crystalline semiconductor material above the substrate semiconductor material, and a second crystalline semiconductor material above the first crystalline semiconductor material, wherein the first crystalline semiconductor material is a different material from the second crystalline semiconductor material;
    converting the first crystalline semiconductor material in the first fin to a first dielectric material, wherein after the converting the first crystalline semiconductor material step, at least a portion of the first crystalline semiconductor material in the first fin remains unconverted;
    converting all of the first crystalline semiconductor material in the second fin to a second dielectric material;
    forming gate structures over the first fin and the second fin; and
    forming source/drain regions on opposing sides of the gate structures.

2. The method of claim 1, wherein each of the converting steps comprises using an oxidation process.

3. The method of claim 1, wherein the remaining portion of unconverted first crystalline semiconductor material in the first fin is continuous from the substrate to the second crystalline semiconductor material in the first fin.

4. The method of claim 1 further comprising:
    before the converting the first crystalline semiconductor material in the second fin, forming a mask over the first fin; and
    after the converting the first crystalline semiconductor material step in the second fin, removing the mask from the first fin.

5. The method of claim 1, further comprising:
    converting portions of the second crystalline semiconductor material in the first fin and the second fin to a third dielectric material, and removing the third dielectric material.

6. The method of claim 1, wherein the first fin is a part of an n-type FinFET and the second fin is a part of a p-type FinFET.

7. The method of claim 1, wherein first crystalline semiconductor material is silicon germanium, the second crystalline semiconductor material is silicon, and dielectric material is silicon germanium oxide.

8. The method of claim 1, wherein the forming source/drain regions on opposing sides of the gate structure further comprises:
    etching the second crystalline semiconductor material and the first crystalline semiconductor material outside of the gate structure; and
    epitaxially growing a third crystalline semiconductor material on the substrate.

9. The method of claim 1, wherein more of the second crystalline semiconductor material is converted into the third dielectric material on the first fin than on the second fin.

10. A method comprising:
    epitaxially growing a first crystalline semiconductor material on a substrate;
    epitaxially growing a second crystalline semiconductor material above the first crystalline semiconductor material;
    patterning the first crystalline semiconductor material and the second crystalline semiconductor material to form a first fin and second fin on the substrate;
    oxidizing at least a portion of the first crystalline semiconductor material in the first fin and all of the first crystalline semiconductor material in the second fin to form a first oxide material, and oxidizing at least a portion of the second crystalline semiconductor material in the first fin and the second fin to form a second oxide material, wherein after the oxidizing of the first fin and the second fin, a portion of the first crystalline semiconductor material in the first fin is not oxidized;
    removing at least a portion of the second oxide material;
    forming isolation regions on the substrate and surrounding at least lower portions of the first fin and the second fin;
    forming gate structures over the first fin, the second fin, and the isolation regions; and
    forming source/drain regions on opposing sides of the gate structures.

11. The method of claim 10, wherein the first crystalline semiconductor material is epitaxially grown as a first blanket layer on the substrate, and the second crystalline semiconductor material is epitaxially grown as a second blanket layer on the first blanket layer, the first blanket layer and the second blanket layer being etched to form the first fin and the second fin.

12. The method of claim 10, wherein the second oxide material is on sidewalls of the second crystalline semiconductor material.

13. The method of claim 10, wherein first crystalline semiconductor material is silicon germanium, the second crystalline semiconductor material is silicon, and the first oxide material in the first crystalline semiconductor material is silicon germanium oxide.

14. The method of claim 10 further comprising:
    after the forming source/drain regions, forming an interlayer dielectric over the source/drain regions;
    removing the gate structures forming recesses in the interlayer dielectric;
    forming active gate structures in the recesses of the interlayer dielectric; and forming contacts through the interlayer dielectric to contact the source/drain regions.

15. The method of claim 10 further comprising:
before the oxidizing at least the portion of the first crystalline semiconductor material in the first fin and the second fin:
forming a mask over the first fin;
performing a first oxidizing process on the second fin to oxidize portions of the second fin;
removing the mask from the first fin, wherein after the mask is removed, the oxidizing at least the portion of the first crystalline semiconductor material in the first fin and the second fin is performed; and
removing the second oxide material and the oxidized portions of the second fin.

16. The method of claim 15, wherein after the removing the second oxide material and the oxidized portions of the second fin, the first fin has a first width as measured in a first plane parallel to a major surface of the substrate and the second fin has a second width as measured in the first plane, the second width being less than the first width.

17. A method comprising:
forming a first fin and a second fin on a substrate, the first fin and the second fin each comprising a first crystalline semiconductor material on a substrate and a second crystalline semiconductor material above the first crystalline semiconductor material;
oxidizing the second fin to oxidize all of the first crystalline semiconductor material in the second fin to form a first oxide material;
oxidizing the first fin to oxidize a portion of the first crystalline semiconductor material in the first fin to form a second oxide material, wherein after the oxidizing of the first fin, a portion of the first crystalline semiconductor material in the first fin is not oxidized;
removing a portion of the first and second oxide materials;
forming isolation regions on the substrate and surrounding at least lower portions of the first fin and the second fin;
forming gate structures over the first fin, the second fin, and the isolation regions; and
forming source/drain regions on opposing sides of the gate structures.

18. The method of claim 17, wherein oxidizing the second fin comprises oxidizing sidewalls of the second crystalline semiconductor material in the second fin to form a third oxide material, and wherein oxidizing the first fin comprises oxidizing sidewalls of the second crystalline semiconductor material in the first fin to form a fourth oxide material, further comprising:
removing the third and fourth oxide materials from the respective sidewalls of the second and first fins.

19. The method of claim 18, wherein oxidizing the first fin further comprises oxidizing sidewalls of a first portion of patterned substrate material, and wherein oxidizing the second fin further comprises oxidizing sidewalls of a second portion of patterned substrate material.

20. The method of claim 1, wherein the third dielectric material is on sidewalls of the second crystalline semiconductor material.

* * * * *